(12) United States Patent
Nam

(10) Patent No.: US 9,391,088 B2
(45) Date of Patent: Jul. 12, 2016

(54) NONVOLATILE MEMORY DEVICE

(71) Applicant: Sang-Wan Nam, Hwaseong-Si (KR)

(72) Inventor: Sang-Wan Nam, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/674,188

(22) Filed: Mar. 31, 2015

(65) Prior Publication Data

US 2016/0064388 A1    Mar. 3, 2016

(30) Foreign Application Priority Data

Sep. 1, 2014   (KR) ................. 10-2014-0115313

(51) Int. Cl.
*H01L 27/115* (2006.01)
*H01L 29/82* (2006.01)
*G11C 16/04* (2006.01)
*G11C 11/34* (2006.01)

(52) U.S. Cl.
CPC ...... *H01L 27/1157* (2013.01); *H01L 27/11582* (2013.01)

(58) Field of Classification Search
CPC .................. H01L 27/1157; H01L 27/11582
USPC .......... 257/214, 321, 324, 368, 391, E27.081, 257/E27.104, E29.262, E29.309, E21.21, 257/E21.41; 365/185.03, 185.17, 185.18, 365/185.22, 185.29; 438/478, 628
See application file for complete search history.

(56) References Cited

U.S. PATENT DOCUMENTS

| | | | |
|---|---|---|---|
| 5,978,276 A | 11/1999 | Wong | |
| 6,958,936 B2 | 10/2005 | Quader et al. | |
| 7,095,656 B2 | 8/2006 | Lee | |
| 7,679,133 B2 | 3/2010 | Son et al. | |
| 8,107,300 B2 | 1/2012 | Ogura et al. | |
| 8,203,876 B2 | 6/2012 | Goda et al. | |
| 8,218,369 B2 | 7/2012 | Lin et al. | |
| 8,493,789 B2 * | 7/2013 | Yoon ................... | G11C 16/0483 365/185.05 |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,687,424 B2 | 4/2014 | Yoon et al. | |
| 2007/0183204 A1* | 8/2007 | Kim ................... | G11C 16/0483 365/185.17 |
| 2009/0027955 A1* | 1/2009 | Koh ................... | G11C 13/0007 365/163 |
| 2011/0233648 A1 | 9/2011 | Seol et al. | |
| 2012/0081958 A1* | 4/2012 | Lee ................... | G11C 16/0483 365/185.05 |
| 2013/0033938 A1* | 2/2013 | Park ................... | G11C 11/5628 365/185.22 |
| 2013/0094294 A1* | 4/2013 | Kwak ................. | H01L 27/1157 365/185.03 |
| 2013/0188423 A1* | 7/2013 | Nam ..................... | G11C 16/04 365/185.17 |
| 2013/0215684 A1* | 8/2013 | Oh ..................... | H01L 27/11582 365/185.29 |
| 2013/0329496 A1 | 12/2013 | Lee et al. | |
| 2015/0179271 A1 | 6/2015 | Nam et al. | |

FOREIGN PATENT DOCUMENTS

| | | |
|---|---|---|
| JP | 09260616 A | 10/1997 |
| KR | 10-1017757 B1 | 2/2011 |
| KR | 10-2015-0072181 A | 6/2015 |

* cited by examiner

*Primary Examiner* — Dao H Nguyen

(74) *Attorney, Agent, or Firm* — Volentine & Whitt, PLLC

(57) ABSTRACT

The nonvolatile memory device includes a plurality of memory cells being stacked in a direction perpendicular to a substrate. A string select transistor is connected between the memory cells and a bit line. A string select line is connected to the string select transistor. A one directional device is connected between the substrate and the string select line and configured to transmit a bias voltage from the substrate toward the string select line in an erase operation.

20 Claims, 27 Drawing Sheets

FIG. 5

| SSL | Floating(Vssl) | Coupling with WL, BL, CSL |
|---|---|---|
| WL | Vers_wl | |
| GSL | Vss → Floating(Vgsl) | GSL Delayed Scheme |
| PPW | Vers | |

NONVOLATILE MEMORY DEVICE

CROSS-REFERENCE TO RELATED APPLICATIONS

This U.S. non-provisional patent application claims priority under 35 U.S.C. §119 to Korean Patent Application No. 10-2014-0115313, filed on Sep. 1, 2014, the entire contents of which are hereby incorporated by reference.

BACKGROUND OF THE INVENTION

The inventive concept relates to semiconductor memories, and more particularly, to a nonvolatile memory device.

A semiconductor memory device is a memory device which is embodied using a semiconductor such as silicon Si, germanium Ge, gallium arsenide GaAs, indium phosphide InP, etc. A semiconductor memory device may be classified into a volatile semiconductor memory device or a nonvolatile semiconductor memory device.

A volatile memory device loses its stored data when its power supply is interrupted. Examples of the a volatile memory device include a static RAM (SRAM), a dynamic RAM (DRAM), a synchronous DRAM (SDRAM), etc. A nonvolatile memory device retains its stored data even when its power supply is interrupted. Examples of a nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc. A flash memory may be classified into a NOR type flash memory or a NAND type flash memory.

To improve the integration of a semiconductor memory, a three-dimensional semiconductor memory device having a three-dimensional array structure is being studied. A height of a three-dimensional semiconductor memory device being stacked is a growing trend. As the height being stacked increases, a distance from a substrate becomes different depending on a location within a NAND string. Thus, a string select line or a ground select line being floated in an erase operation may be placed in various erase bias environments.

SUMMARY

Embodiments of the inventive concept provide a nonvolatile memory device. The nonvolatile memory device may include a plurality of memory cells being stacked in a direction perpendicular to a substrate, and a string select transistor connected between the memory cells and a bit line. A string select line is connected to the string select transistor, and a one directional device is connected between the substrate and the string select line and is configured to transmit a bias voltage from the substrate toward the string select line in an erase operation.

Embodiments of the inventive concept also provide a nonvolatile memory device that may include: a plurality of memory cells being stacked on a first pocket well in a direction perpendicular to the first pocket well; first and second string select transistors serially connected between the memory cells and a bit line; a first string select line being connected to the first string select transistor; a second string select line being connected to the second string select transistor; a first one directional device which is connected between the first pocket well and the first string select line and configured to transmit a first bias voltage from the first pocket well toward the first string select line in an erase operation; and a second one directional device which is connected between a second pocket well separated from the first pocket well and the second string select line and configured to transmit a second bias voltage from the second pocket well toward the second string select line in an erase operation.

Embodiments of the inventive concept also provide a nonvolatile memory device that may include: a plurality of memory cells being stacked on a first pocket well in a direction perpendicular to the first pocket well; a ground select transistor being connected between the memory cells and the first pocket well; a ground select line being connected to the ground select transistor; and a ground select line one directional device connected between a second pocket well separated from the first pocket well and the ground select line, and configured to transmit a bias voltage from the second pocket well toward the ground select transistor in an erase operation.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 5 is a table illustrating a voltage bias in an erase operation of a nonvolatile memory device of FIG. 1.

DETAILED DESCRIPTION OF PREFERRED EMBODIMENTS

Figure 1:
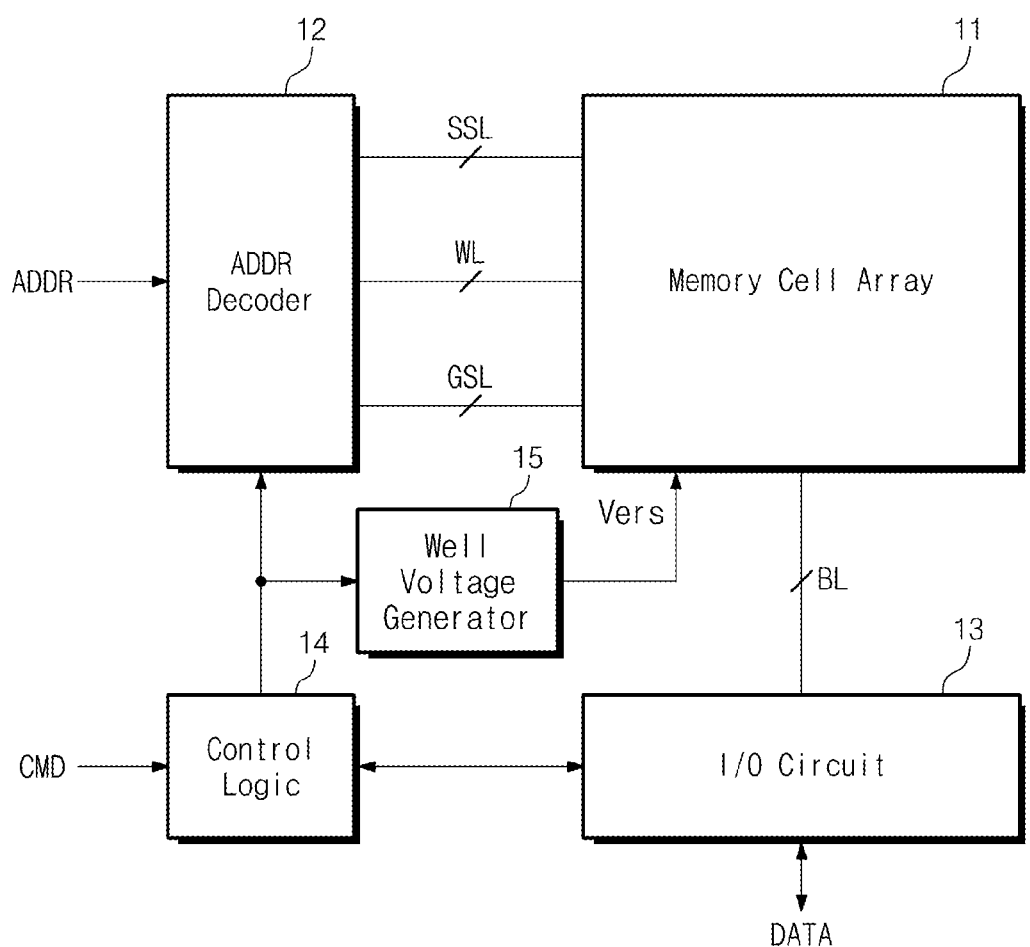
FIG. 1 is a block diagram illustrating a nonvolatile memory device in accordance with the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a nonvolatile memory device in accordance with the inventive concept. Referring to FIG. 1, a nonvolatile memory device 10 may include a memory cell array 11, an address decoder 12, an input/output circuit 13, control logic 14 and a well voltage generator 15.

The memory cell array 11 may be connected to the address decoder 12. The memory cell array 11 may be connected to the input/output circuit 13 through bit lines BL. The memory cell array 11 may include a plurality of memory cells. The memory cells may be stacked on a substrate or a pocket well. Each memory cell can store one or more bits.

The address decoder 12 may be connected to the memory cell array 11 through a plurality of lines. For example, the lines may be string select lines SSL, word lines WL, and ground select lines GSL. The address decoder 12 may be configured to operate in response to a control of the control logic 14.

The address decoder 12 can receive addresses ADDR from the outside. The address decoder 12 decodes a row address among the received addresses ADDR. The address decoder 12 selects a word line corresponding to the decoded row address. The address decoder 12 selects a word line corresponding to the addresses ADDR according to the decoded row address.

In an erase operation, the address decoder 12 selects a memory block to be erased. The address decoder 12 applies bias voltages to parts of the lines and floats the remaining lines. The time when the remaining lines are floated is controlled by the control logic 14. A word line erase voltage is applied to word lines of a selected memory block. An erase voltage Vers is applied to a substrate or a pocket well of the memory cell array 11. In the case of using a ground select line delayed scheme, ground select lines are floated after a specific time has elapsed from the time when an erase voltage Vers is applied.

The address decoder 12 may be configured to decode a column address among the received addresses ADDR. The address decoder 12 can transfer the decoded column address to the input/output circuit 13. The address decoder 12 may include a row decoder decoding a row address, a column decoder decoding a column address and an address buffer storing an address.

The input/output circuit 13 may be connected to the memory cell array 11 through bit lines BL. The input/output circuit 13 can operate in response to a control of the control logic 14. The input/output circuit 13 can receive a decoded column address from the address decoder 12. The input/output circuit 13 selects bit lines BL using the decoded column address.

The control logic 14 may be connected to the address decoder 12, the input/output circuit 13 and the well voltage generator 15. The control logic 14 may be configured to an overall operation of the nonvolatile memory device 10. The control logic 14 can operate in response to a command signal being transferred from the outside.

The well voltage generator 15 operates according to a control of the control logic 14. The well voltage generator 15 is configured to generate a high voltage. In an erase operation, an erase voltage Vers generated by the well voltage generator 15 may be transferred to the substrate or the pocket well of the memory cell array 11.

Figure 2:
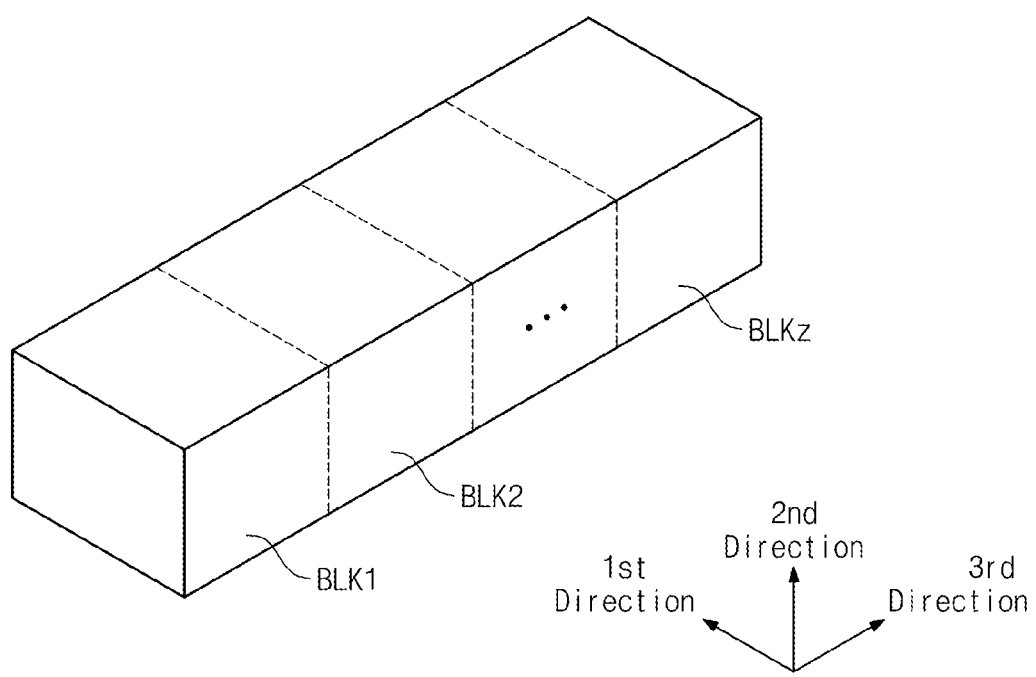
FIG. 2 is a perspective view illustrating a memory cell array 11 of FIG. 1.

FIG. 2 is a perspective view illustrating a memory cell array 11 of FIG. 1. Referring to FIG. 2, the memory cell array 11 may include a plurality of memory blocks BLK1~BLKz. Each memory block has a three-dimensional structure. For example, each memory block may include structures extending along first through third directions. Each memory block may include a plurality of NAND strings extending along the second direction. A plurality of NAND strings is provided along the first and third directions.

Each memory block may be connected to a plurality of bit lines BL, a plurality of string select lines SSL, a plurality of ground select lines GSL, a plurality of word lines WL and a common source line CSL. Each NAND string may be connected to a bit line BL, a string select line SSL, a ground select line GSL, word lines WL and a common source line CSL.

The memory blocks BLK1~BLKz are selected by the address decoder 12 illustrated in FIG. 1. For example, the address decoder 12 may be configured to select a memory block BLKi corresponding to a decoded row address among the memory blocks BLK1~BLKz.

Figure 3:
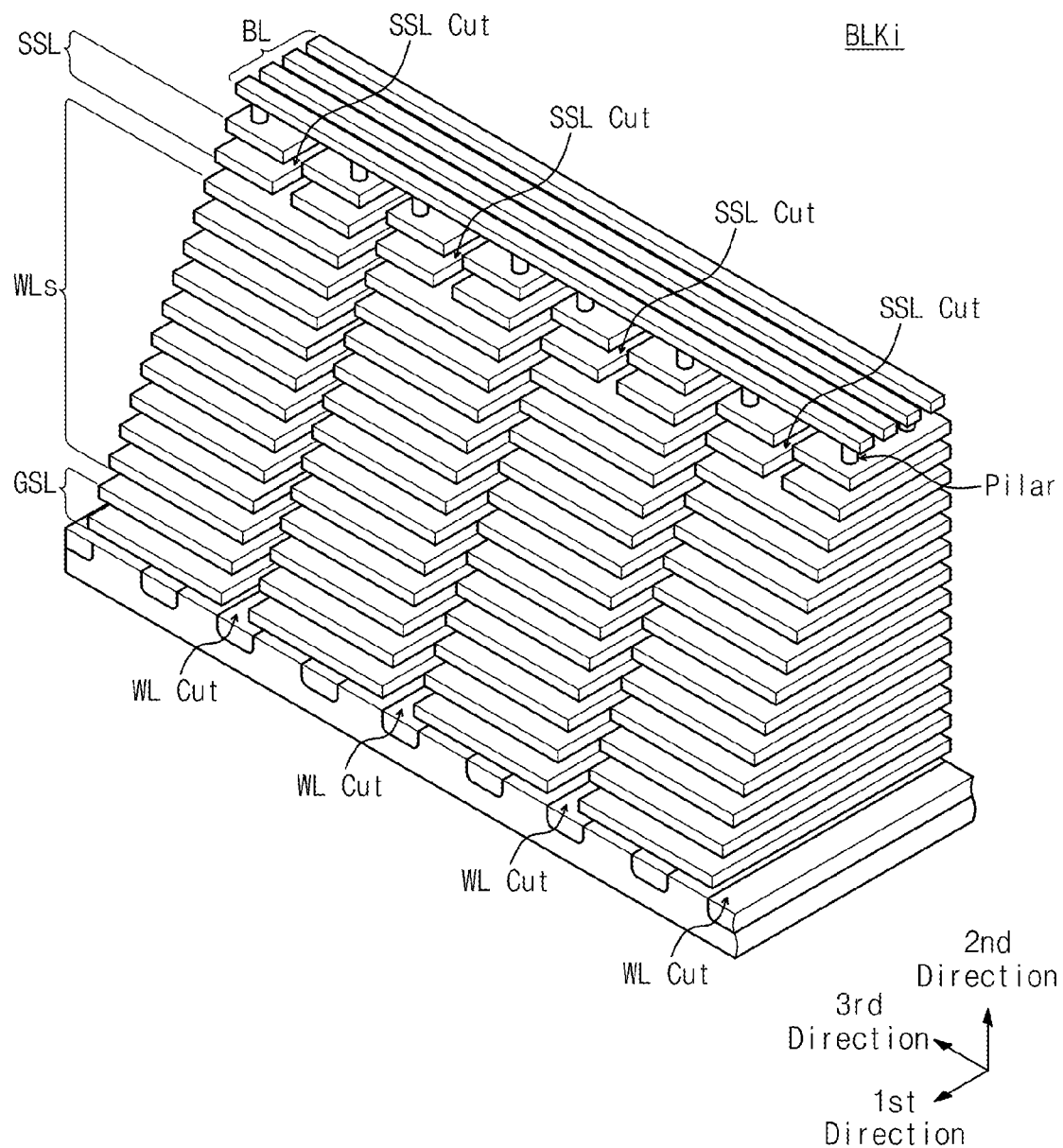
FIG. 3 is a drawing illustrating one block of the memory blocks illustrated in FIG. 2.

FIG. 3 is a drawing illustrating one memory block BLKi of the memory blocks illustrated in FIG. 2. Referring to FIG. 3, four sub blocks may be formed on the substrate or the pocket well. At least one ground select line GSL, a plurality of word lines WL and at least one string select line SSL are stacked between word line cuts on the substrate or the pocket well in a plate-like form to form each sub block. At least one dummy line may be stacked between the ground select line GSL and the word lines WL may be stacked in a plate-like form, or at least one dummy line may be stacked between the word lines WL and the string select line SSL may be stacked in a plate-like form.

The at least one string select line SSL may be divided by a string select line cut. Although not illustrated, each word line cut may include the common source line CSL. For example, the common source line CSL included in each word line cut may be connected in common A pillar connected to the bit line BL may penetrate at least one ground select line GSL, a plurality of word lines WL and at least one string select line SSL to form a string.

In FIG. 3, an object between the word line cuts is illustrated by a sub block but the inventive concept is not limited thereto. For example, the sub block of the inventive concept may refer to an object between a word line cut and a string select line cut 'sub block'.

Figure 4:
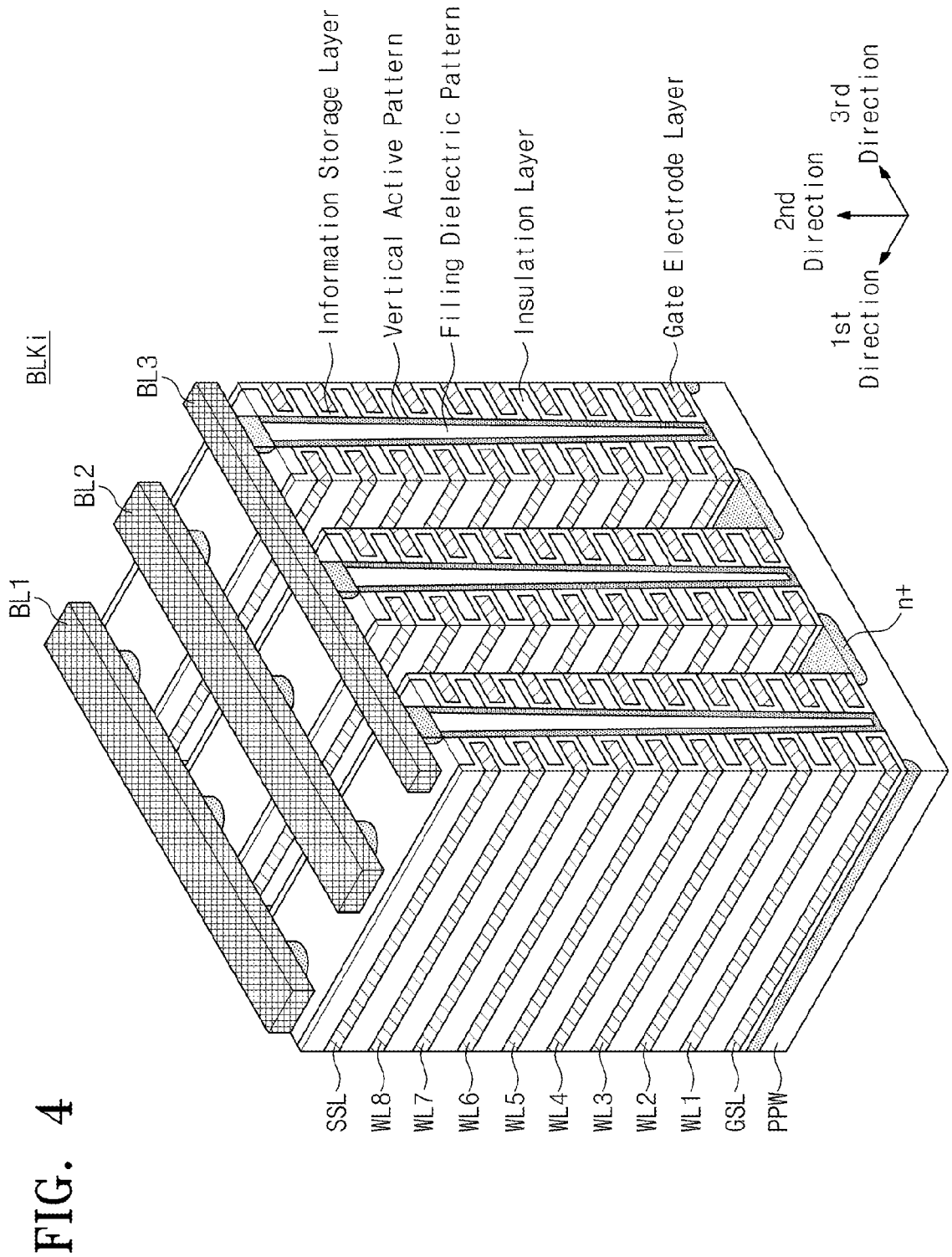
FIG. 4 is a perspective cross sectional view illustrating the memory block illustrated in FIG. 3.

FIG. 4 is a perspective cross sectional view illustrating the memory block BLKi illustrated in FIG. 3. Referring to FIG. 4, the memory block BLKi may be formed along the second direction perpendicular to a pocket well PPW. However, the pocket well PPW is not limited thereto. It is assumed that the pocket well PPW is defined by a P-type semiconductor. An n+ doping area may be formed in the pocket well PPW along the first direction.

A gate electrode layer and an insulation layer are alternately deposited on the pocket well PPW. An information storage layer may be formed between the gate electrode layer and the insulation layer.

A V shape pillar is formed by cutting the gate electrode layer and the insulation layer along a vertical direction. The pillar penetrates the gate electrode layer and the insulation layer to be connected to the pocket well PPW. The inside of the pillar is a filing dielectric pattern and may be formed by an insulation material such as silicon oxide. The outside of the pillar is a vertical active pattern and may be formed by a channel semiconductor.

The gate electrode layer of the memory block BLKi may be connected to a ground select line GSL, a plurality of word lines WL1~WL8 and a string select line SSL. The pillar of the memory block BLKi may be a plurality of bit lines BL1~BL3. In FIG. 4, one memory block has two select lines GSL and SSL, eight word lines WL1~WL8 and three bit lines BL1~BL3 but there may be more or less lines.

Figure 6:
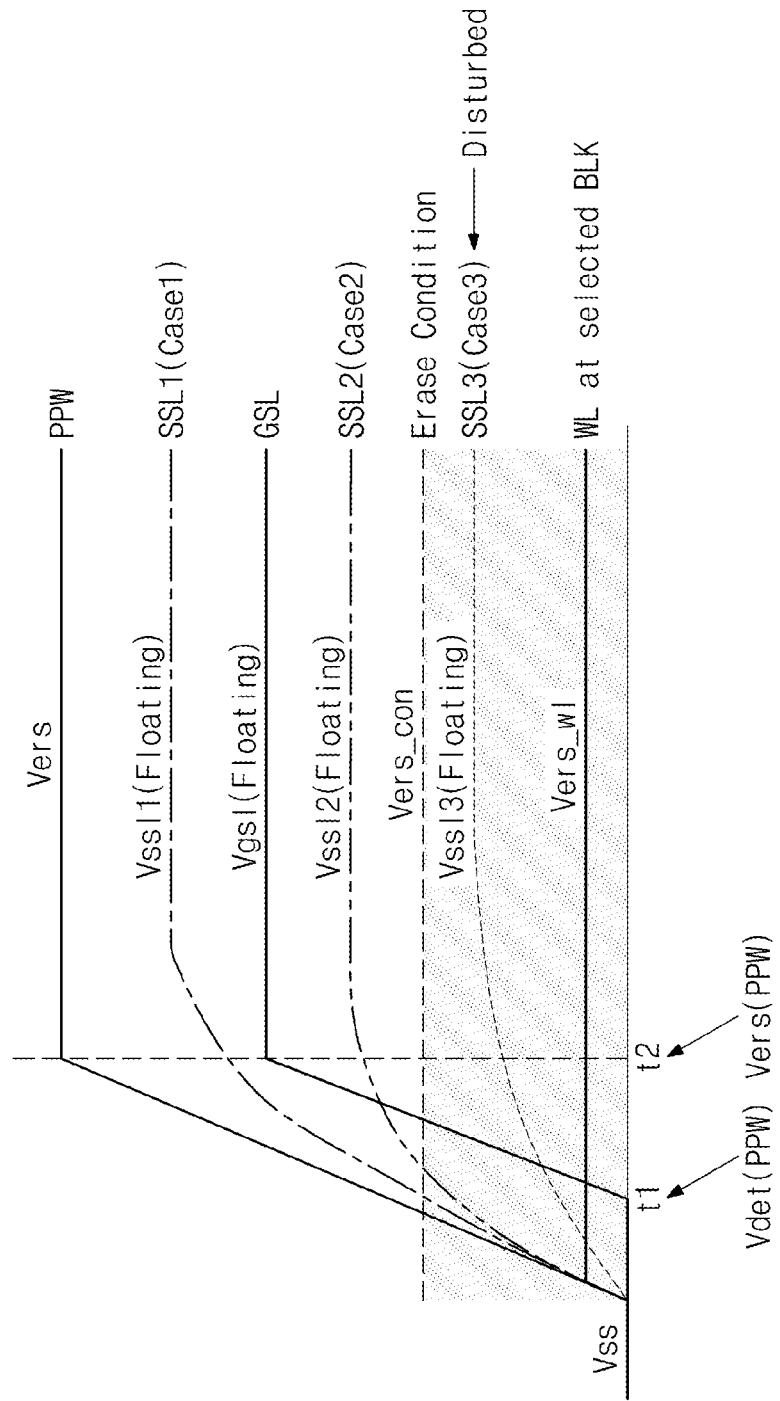
FIG. 6 is a timing diagram illustrating a voltage bias in an erase operation of a nonvolatile memory device of FIG. 1.

FIG. 5 is a table for illustrating a voltage bias in an erase operation of a nonvolatile memory device of FIG. 1. FIG. 6 is a timing diagram illustrating a voltage bias in an erase operation of a nonvolatile memory device of FIG. 1. Referring to FIGS. 5 and 6, a string select line SSL may have various bias states according to peripheral influence.

In an erase operation, one of memory blocks of the nonvolatile memory device 10 may be selected. Voltage biases illustrated in FIGS. 5 and 6 may be applied to the selected memory block. An erase voltage Vers may be applied to a substrate or a pocket well. The substrate or the pocket well can reach the erase voltage Vers at second time t2. For example, the erase voltage Vers may be a high voltage of about 20V. A word line erase voltage Vers_wl may be applied to word lines WL of the selected memory block. For example, the word line erase voltage Vers_wl may be 0.5V. After a ground voltage Vss is applied to a ground select line GSL using a GSL delayed scheme, the ground select line GSL may be floated at first time t1. If a voltage of the substrate or the pocket well reaches a specific voltage Vdet at the first time t1, the ground select line GSL may be floated. A voltage of the floated ground select line GSL can rise to a ground select line voltage Vgsl by a coupling phenomenon. A voltage of the floated ground select line GSL can rise from the first time t1 to reach the ground select line voltage Vgsl at the second time t2. For example, the ground select line voltage Vgsl may be 13V. The string select lines SSL may be floated. Voltages of the floated string select lines SSL can reach a string select line voltage Vssl. Then memory cells of the selected memory block may be erased due to a great voltage difference between the word line erase voltage Vers_wl and the erase voltage Vers.

At this time, the floated string select lines SSL may have various electric potentials according to a peripheral phenomenon. The string select lines SSL may couple to word lines WL, the bit lines BL or the common source line CSL. Thus, voltages of the string select lines SSL may rise to various voltages after being floated. For example, in a case 1, a string select line voltage Vssl1 may be located between the erase voltage Vers and the ground select line voltage Vgsl. In a case 2, a string select line voltage Vssl2 may be located between the ground select line voltage Vgsl and an erase condition voltage Vers_con. In a case 3, a string select line voltage Vssl3 may be formed to be lower than the erase condition voltage Vers_con.

In the case that a voltage of the string select line SSL is lower than the erase condition voltage Vers_con, a string select transistor SST connected to the string select line SSL may be erased. If the string select transistor SST is erased, the string select transistor SST cannot perform a string select function and a disturbance may occur in memory cells connected to the string select transistor SST.

For example, in the cases 1 and 2, since the string select line voltages Vssl1 and Vssl2 are higher than the erase condition voltage Vers_con, the string select transistor SST connected to the string select line SSL can operate normally. In the case 3, since the string select line voltage Vssl3 is lower than the erase condition voltage Vers_con, the string select transistor SST3 connected to the string select line SSL3 may be erased. If the string select transistor SST3 is erased, a threshold voltage of the string select transistor SST3 may be lowered. Then the string select transistor SST3 cannot perform a string select function anymore, and a disturbance may occur in memory cells connected to the string select transistor SST3. Thus, a method is needed to prevent string select transistors of a selected memory block being erased.

Figure 7:
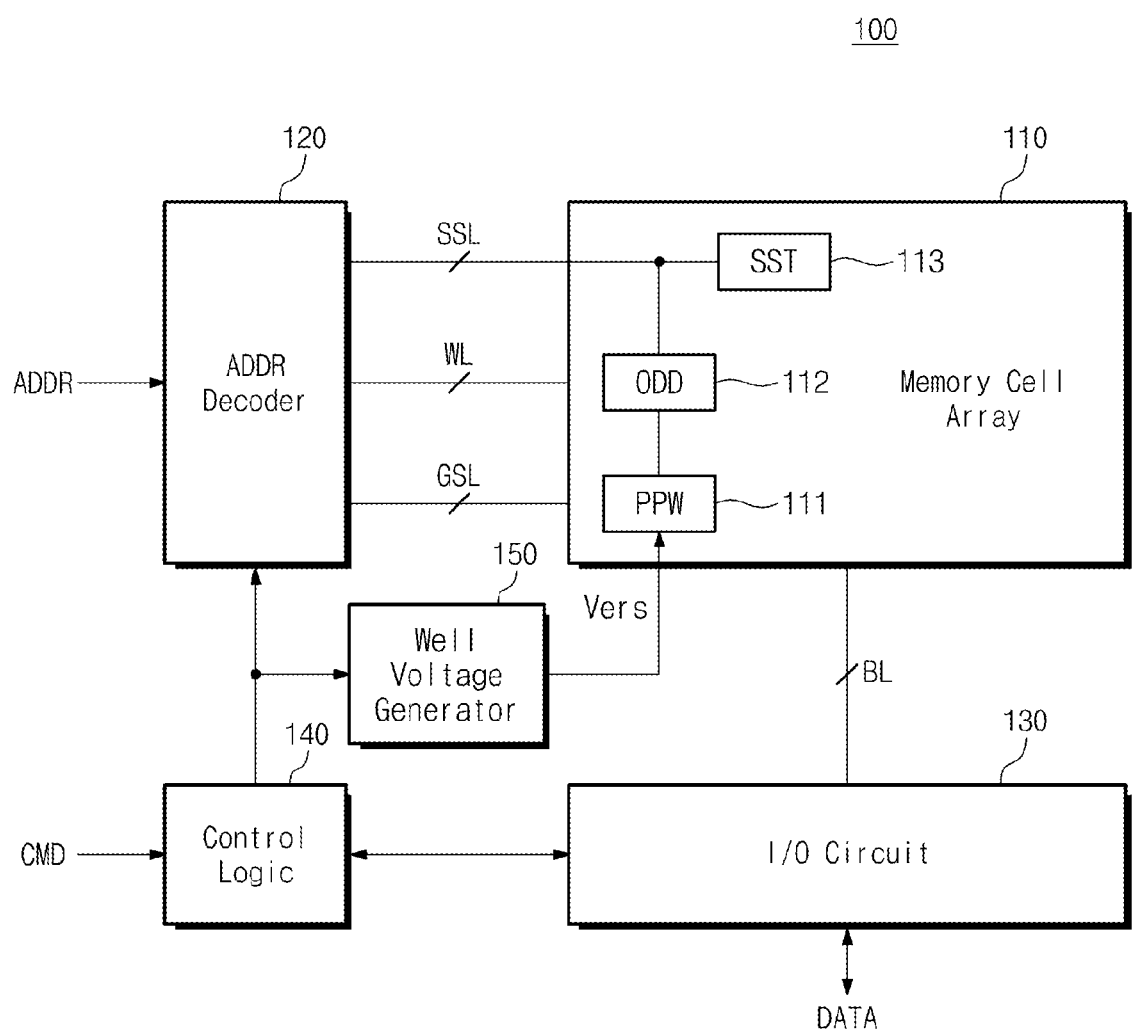
FIG. 7 is a block diagram illustrating a nonvolatile memory device in accordance with a first embodiment of the inventive concept.

FIG. 7 is a block diagram illustrating a nonvolatile memory device in accordance with a first embodiment of the inventive concept. Referring to FIG. 7, a nonvolatile memory device 100 may include a memory cell array 110, an address decoder 120, an input/output circuit 130, control logic 140 and a well voltage generator 150.

The memory cell array 110 may be connected to the address decoder 120. The memory cell array 110 may be connected to the input/output circuit 130 through bit lines BL. The memory cell array 110 may include a plurality of memory cells. The memory cells may be stacked on a substrate. For example, a pocket well 111 may be formed on the substrate. The pocket well 111 may be formed of a P-type semiconductor. However, the pocket well 111 is not limited thereto. The memory cells may be stacked on the pocket well 111. Each memory cell can store one or more bits.

String select lines SSL may be connected to the pocket well 111 through a one directional device 112. The one directional device 112 may include a plurality of diodes. Each string select line SSL may be connected to the pocket well 111 through each diode. For example, diodes are connected so that a current flows from the pocket well 111 to the string select line SSL. Thus, in the case that a voltage of the pocket well 111 is higher than the string select lines SSL, diodes of the one directional device 112 can be turned on.

In an erase operation, an erase voltage which is a high voltage may be applied to the pocket well 111. Thus, diodes of the one directional device 112 are turned on and a voltage lower than the erase voltage Vers by a threshold voltage of the diodes may be supplied to the string select lines SSL. Thus, the string select lines SSL can be biased in a voltage state higher than an erase condition voltage Vers_con (refer to FIG. 6) to prevent string select transistors 113 from being erased.

The address decoder 120 may be connected to the memory cell array 110 through string select lines SSL, word lines WL and ground select lines GSL. The address decoder 120 may be configured to operate in response to a control of the control logic 140.

The address decoder 120 can receive an address ADDR from an external source. The address decoder 120 decodes a row decoder among the addresses ADDR. The address decoder 120 can select a word line WL corresponding to the decoded row address.

In an erase operation, the address decoder 120 can select a block to be erased. The address decoder 120 can apply bias voltages to a part of the lines and can float the remaining part of the lines. The time when the remaining part of the lines is floated can be controlled by the control logic 140. A word line erase voltage Vers_wl may be applied to word lines WL of the selected block. An erase voltage Vers may be applied to the pocket well 111 of the memory cell array 110. In the case of using a GSL delayed scheme, the ground select line GSL may be floated after specific delay time from the time when the erase voltage Vers is applied.

The address decoder 120 may be configured to a column address among the received addresses ADDR. The address decoder 120 can transfer the decoded column address to the input/output circuit 130. For example, the address decoder 120 may include a row decoder decoding a row address, a column decoder decoding a column address and an address buffer storing an address ADDR.

The input/output circuit 130 may be connected to the memory cell array 110 through bit lines BL. The input/output circuit 130 can operate in response to a control of the control logic 140. The input/output circuit 130 can receive the decoded column address from the address decoder 120. Using the decoded column address, the input/output circuit 130 can select bit lines BL.

In a program operation, the input/output circuit 130 receives data DATA from the outside and programs the received data in the memory cell array 110. In a read operation, the input/output circuit 130 reads data DATA from the memory cell array 110 and transfers the read data DATA to the outside. The input/output circuit 110 can read data from a first storage area of the memory cell array 110 and write the read data in a second storage area of the memory cell array 110. For example, the input/output circuit 130 can perform a copy-back operation.

The input/output circuit 130 may include constituent elements such as a page buffer (or page register), a column select circuit, etc. The input/output circuit 130 may include a sense amplifier, a write driver, a column select circuit, etc.

Although not illustrated in FIG. 1, the nonvolatile memory device 100 may include a constituent element such as a buffer circuit. In this case, the buffer circuit may receive data to be programmed from the outside and transfer read data to the outside. The input/output circuit 130 may receive data from the buffer circuit in a program operation and transfer data read from the memory cell array 110 to the buffer circuit in a read operation.

The control logic 140 may be connected to the address decoder 120, the input/output circuit 130 and the well voltage generator 150. The control logic 140 may be configured to control an overall operation of the nonvolatile memory device 100. The control logic 140 can operate in response to a command signal CMD being transferred from the outside.

The well voltage generator 150 can operate according to a control of the control logic 140. The well voltage generator 150 may be configured to generate a high voltage. For example, an erase voltage Vers generated by the well voltage generator 150 in an erase operation may be transferred to the pocket well 111 by the memory cell array 110.

Figure 8:
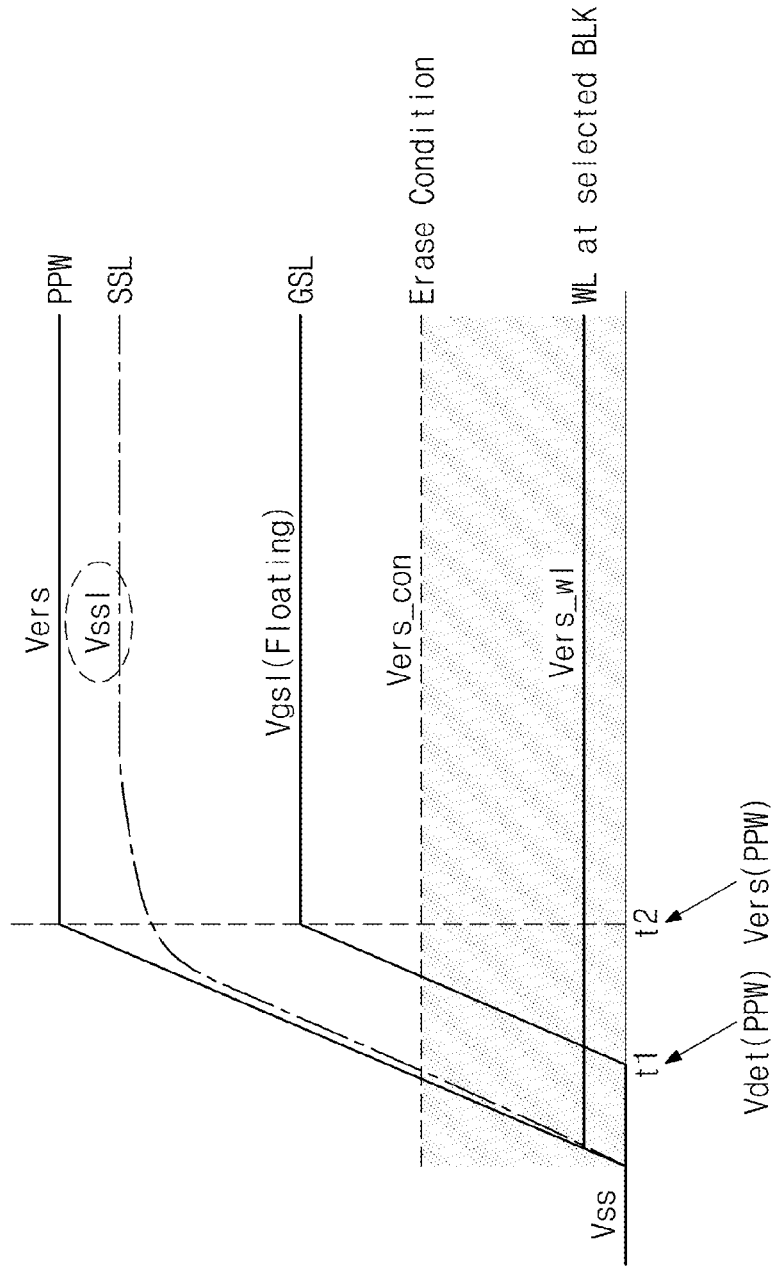
FIG. 8 is a timing diagram illustrating a voltage bias in an erase operation of the nonvolatile memory device of FIG. 7.

FIG. 8 is a timing diagram illustrating a voltage bias in an erase operation of the nonvolatile memory device of FIG. 7. Referring to FIGS. 7 and 8, in an erase operation, a string select line voltage Vssl may be formed between a ground select line voltage Vgsl and the erase voltage Vers. Since a basic setting of a voltage bias of FIG. 8 is identical or similar to the voltage bias of FIG. 6, a description thereof is omitted.

String setting lines SSL may be connected to the pocket well 111 through the one directional device 112. Thus, the string select line voltage Vssl can maintain a constant voltage regardless of a coupling to peripheral circuits. For example, the string select line voltage Vssl can be biased at a voltage lower than the erase voltage Vers by a threshold voltage of a diode. Thus, in an erase operation, the string select lines SSL may be prevented from being erased.

Figure 9:
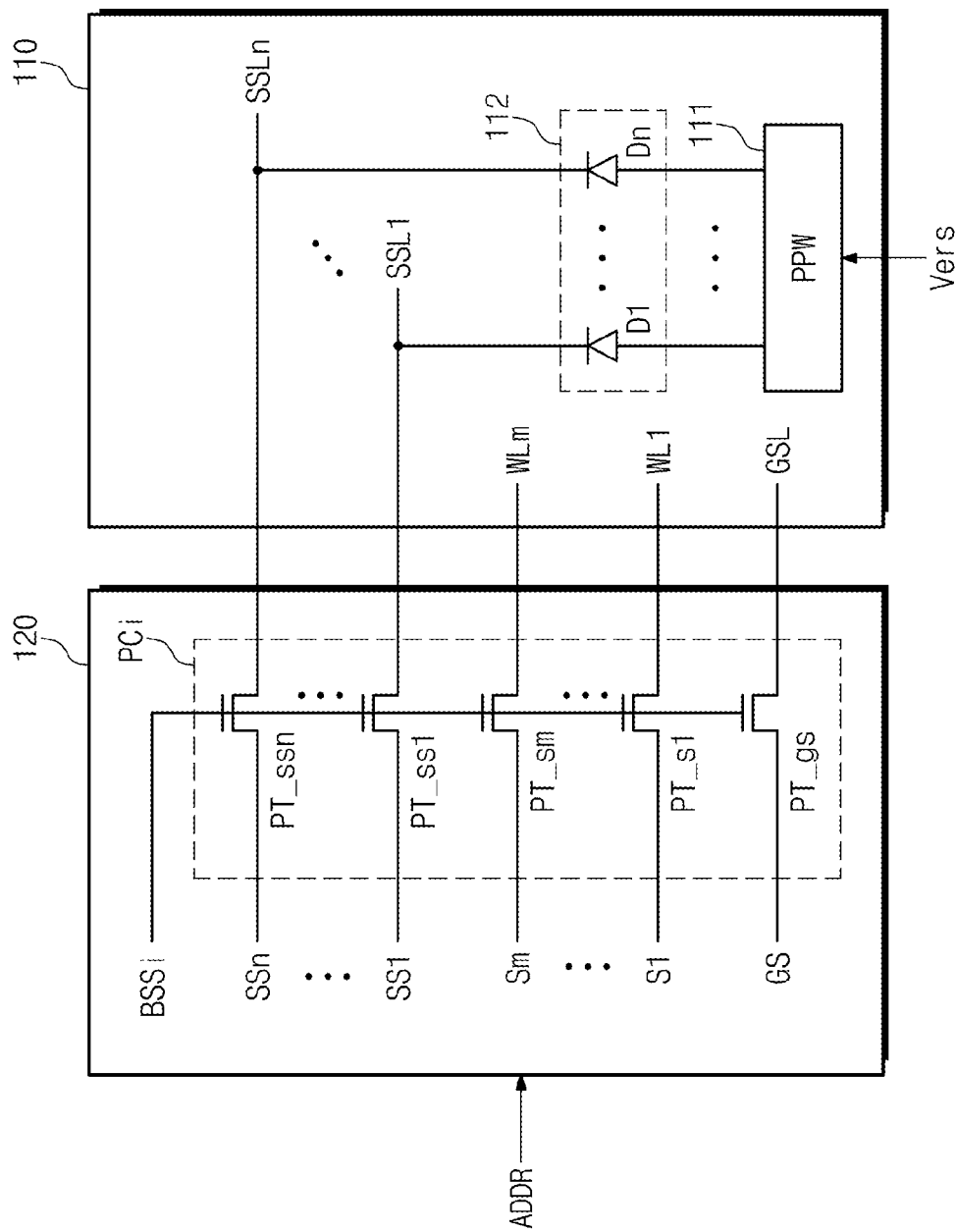
FIG. 9 is a drawing illustrating a one directional device of FIG. 7.

FIG. 9 is a drawing illustrating the one directional device of FIG. 7. Referring to FIG. 9, the one directional device 112 may include a plurality of diodes D1~Dn. The string select lines SSL1~SSLn may be connected to the pocket well 111 through the diodes D1~Dn respectively.

The address decoder 120 may include pass circuits corresponding to memory blocks included in the memory cell array 110. The pass circuit PCi illustrates one of the pass circuits. The pass circuit PCi may include a plurality of pass transistors (PT_ssl~PT_ssn, PT_s1~PT_sn, PT_gs).

The pass transistors (PT_ssl~PT_ssn, PT_s1~PT_sn, PT_gs) may be connected to the string select lines SSL1~SSLn, word lines WL1~WLm and a ground select line GSL respectively in response to a block select signal BSSi. The pass transistors may be high voltage transistors.

An activate block select signal BSSi may be supplied to the pass circuit PCi corresponding to a selected memory block among a plurality of memory blocks BLK1~BLKz. That is, the string select lines SSL1~SSLn, the word lines WL1~WLm and the ground select line GSL of the selected memory block may be connected to the address decoder 120. In an erase operation, the address decoder 120 can provide the word line erase voltage Vers_wl to the word lines WL1~WLm of the selected memory block. The address decoder 120 can float the string select lines SSL1~SSLn and the ground select line GSL. The address decoder 120 can float the ground select line GSL after specific time has elapsed according to the GSL delayed scheme.

One of the terminals of the diodes D1~Dn may be connected to the pocket well 111. For example, anode terminals of the diodes D1~Dn may be connected to the pocket well 111. The other terminals of diodes D1~Dn may be connected to the string select lines SSL1~SSLn. Cathode terminals of diodes D1~Dn may be connected to the string select lines SSL1~SSLn. The string select lines SSL1~SSLn may be connected to the diodes D1~Dn respectively. Thus, a current may flow in a direction from the pocket well 111 toward the string select lines SSL1~SSLn. The diodes D1~Dn may be connected between the pass circuit PCi and the string select transistors 113.

In an erase operation, an erase voltage Vers may be applied to the pocket well 111. The string select lines SSL1~SSLn may be floated. Thus, a constant string select line voltage Vssl may be applied to the string select lines SSL1~SSLn through the diodes D1~Dn. For example, the string select line voltage Vssl may be a voltage lower than the erase voltage Vers by a threshold voltage of the diodes D1~Dn.

Figure 10:
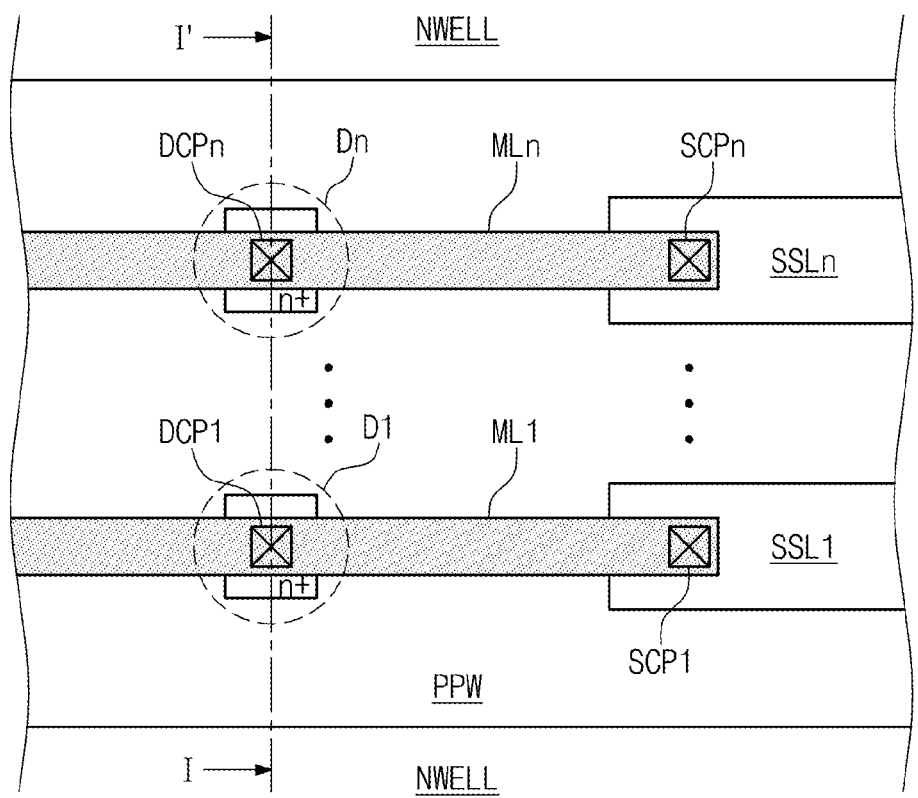
FIG. 10 is a top plan view illustrating an embodiment of the one directional device of FIG. 9.
Figure 11:
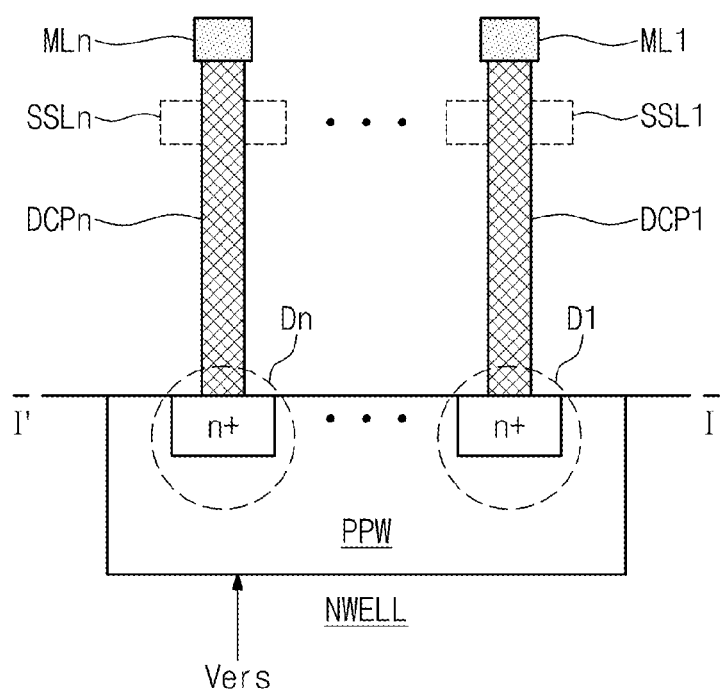
FIG. 11 is a cross sectional view taken along the line I-I' of FIG. 10.

FIG. 10 is a top plan view illustrating an embodiment of the one directional device of FIG. 9. FIG. 11 is a cross sectional view taken along the line I-I' of FIG. 10. Referring to FIGS. 9 and 10, the diodes D1~Dn may be formed by doping an n+ region in the pocket well PPW. The pocket well PPW may be formed on an N well NWELL. The string select lines SSL1~SSLn may be formed on the pocket well PPW. Although not illustrated, the word lines and the ground select line GSL may be stacked between the string select lines SSL1~SSLn and the pocket well PPW to be formed.

The string select lines SSL1~SSLn may be connected to conductive lines ML1~MLn respectively. For example, the string select line SSL1 may be connected to the conductive line ML1 through a SSL connection plug SCP1. The string select line SSLn may be connected to the conductive line MLn through a SSL connection plug SCPn. The conductive lines ML1~MLn may be extended to be connected to the pass circuit PCi of the address decoder 120.

A plurality of n+ regions may be doped on the pocket well PPW in which the string select lines SSL1~SSLn are stacked. The n+ region doped on the pocket well PPW may operate as a diode. Thus, the n+ regions may form diodes D1~Dn.

The diodes D1~Dn may be connected to the conductive lines ML1~MLn respectively. For example, the diode D1 may be connected to the conductive line ML1 through a diode connection plug DCP1. The diode Dn may be connected to the conductive line MLn through a diode connection plug DCPn. The diodes D1~Dn may be stacked on the pocket well PPW in which the string select lines SSL1~SSLn are stacked.

Figure 12:
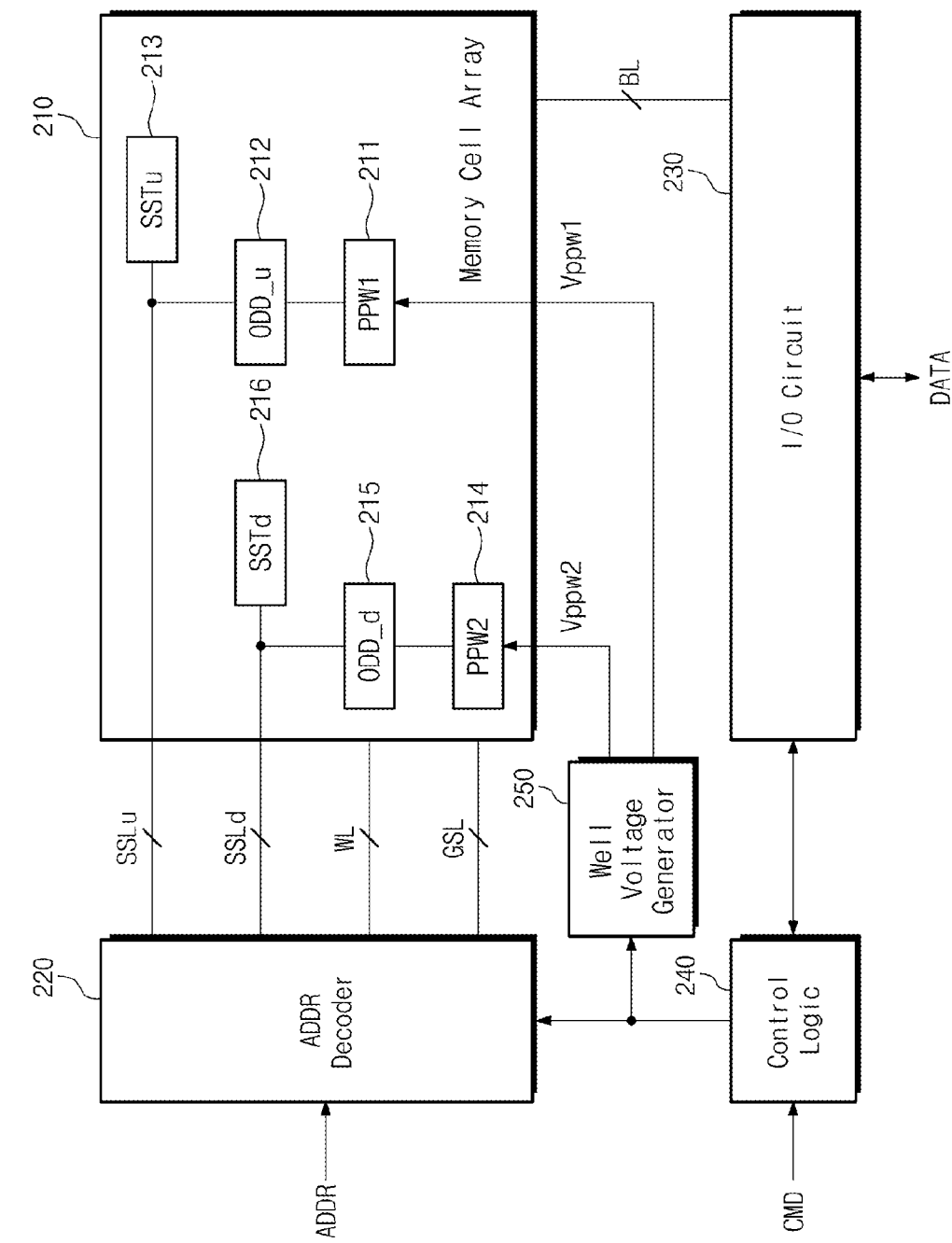
FIG. 12 is a block diagram illustrating a nonvolatile memory device in accordance with a second embodiment of the inventive concept.

FIG. 12 is a block diagram illustrating a nonvolatile memory device in accordance with a second embodiment of the inventive concept. Referring to FIG. 12, a nonvolatile memory device 200 may include a memory cell array 210, an address decoder 220, an input/output circuit 230, control logic 240, and a well voltage generator 250. Since a basic constitution of the nonvolatile memory device 200 is similar or the same as that of the nonvolatile memory device 100 of FIG. 7, a description thereof is omitted.

The memory cell array 210 may include upper string select transistors 213 and lower string select transistors 216. The upper string select transistors 213 may be connected to the address decoder 220 through upper string select lines SSLu. The lower string select transistors 216 may be connected to the address decoder 220 through lower string select lines SSLd.

The memory cell array 210 may include a first pocket well 211 and a second pocket well 214. The first pocket well 211 and the second pocket well 214 may be divided to be formed on an N well NWELL. The memory cells may be stacked on the first pocket well 211 to be formed.

The upper string select lines SSLu may be connected to the first pocket well 211 through an upper one directional device 212. The upper one directional device 212 may include a plurality of upper diodes. The upper string select lines SSLu may be connected to the first pocket well 211 through the upper diodes. For example, the upper diodes may be connected so that a current flows from the first pocket well 211 toward the upper string select line SSLu. Thus, in the case that a voltage of the first pocket well 211 is higher than that of the upper string select lines SSLu, the upper diodes may be turned on.

The lower string select lines SSLd may be connected to the second pocket well 214 through a lower one directional device 215. The lower one directional device 215 may include a plurality of lower diodes. The lower string select lines SSLd may be connected to the second pocket well 214 through the lower diodes. For example, the lower diodes may be connected so that a current flows from the second pocket well 214 toward the lower string select line SSLd. Thus, in the case that a voltage of the second pocket well 214 is higher than that of the lower string select lines SSLd, the lower diodes may be turned on.

In an erase operation, a first pocket well voltage Vppw1 may be applied to the first pocket well 211. For example, the first pocket well voltage Vppw1 may be an erase voltage Vers which is a high voltage. The upper string select lines SSLu may be floated. Thus, the upper diodes may be turned on and a voltage lower than the first pocket well voltage Vppw1 by a threshold voltage of the diode may be provided to the upper string select line SSLu. Thus, the upper string select lines SSLu are biased in a voltage state higher than the erase condition voltage Vers_con (refer to FIG. 6) and thereby the upper string select transistors 213 may be prevented from being erased.

In an operation, a second pocket well voltage Vppw2 may be applied to the second pocket well 214. For example, the second pocket well voltage Vppw2 may be a voltage different from the first pocket well voltage Vppw1. The lower string select lines SSLd may be floated. Thus, the lower diodes may be turned on and a voltage lower than the second pocket well voltage Vppw2 by a threshold voltage of the diode may be provided to the lower string select line SSLd. Thus, the lower string select lines SSLd are biased in a voltage state higher than the erase condition voltage Vers_con (refer to FIG. 6) and thereby the lower string select transistors 216 may be prevented from being erased. Using the second pocket well voltage Vppw2, the lower string select lines SSLd may be maintained at a voltage different from the upper string select lines SSLu.

The control logic 240 can control the well voltage generator 250 so that different voltages are applied to the first and second pocket wells 211 and 214. The well voltage generator 250 may operate according to a control of the control logic 240. The well voltage generator 250 may be configured to generate a high voltage. For example, the first and second pocket well voltages Vppw1 and Vppw2 generated by the well voltage generator 250 may be transferred to the first and second pocket wells 211 and 214 of the memory cell array 210. The first pocket well voltage Vppw1 may be an erase voltage Vers. The second pocket well voltage Vppw2 may be a voltage lower than the first pocket well voltage Vppw1.

Figure 13:
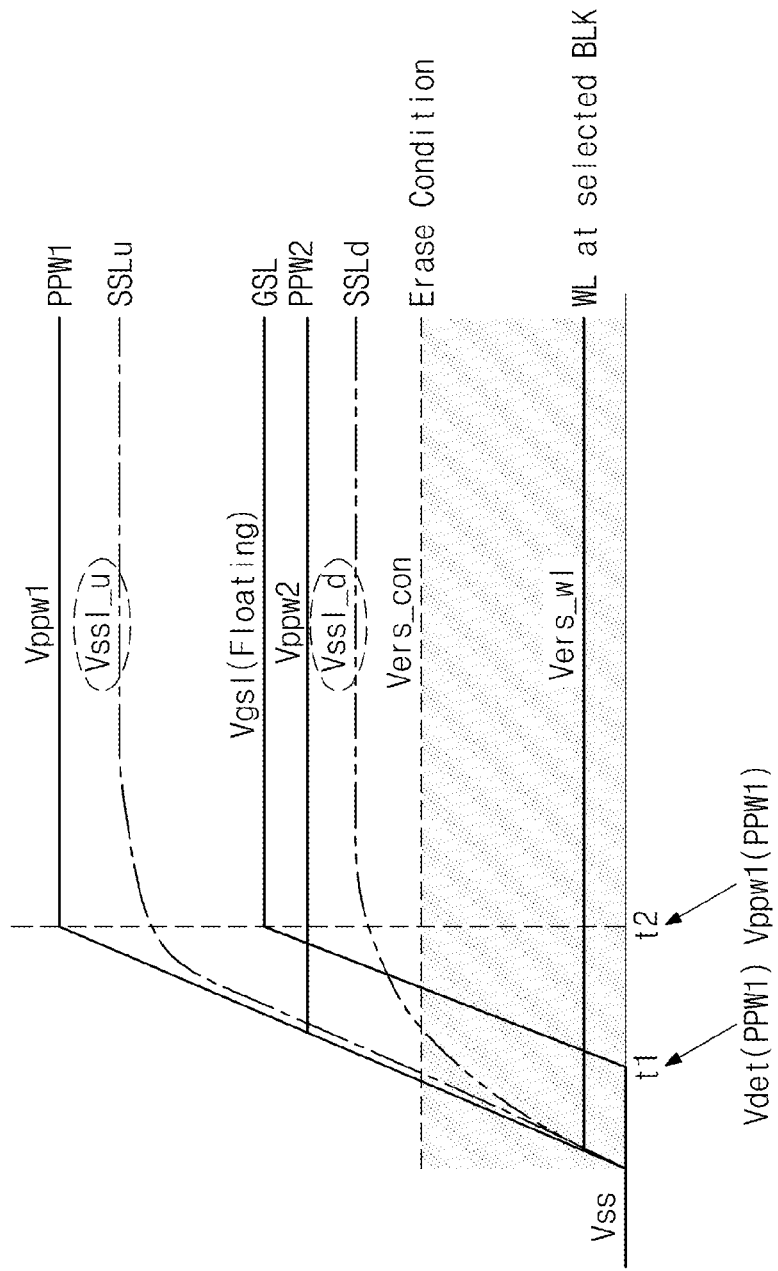
FIG. 13 is a timing diagram illustrating a voltage bias in an erase operation of the nonvolatile memory device of FIG. 12.

FIG. 13 is a timing diagram illustrating a voltage bias in an erase operation of the nonvolatile memory device of FIG. 12. Referring to FIGS. 12 and 13, in an erase operation, the upper and lower string select line voltages Vssl_u and Vssl_d may be higher than the erase condition voltage Vers_con. Since a basic setting of a voltage bias of FIG. 13 is the same or similar to the voltage bias of FIG. 6, a description thereof is omitted.

The string select lines SSLu may be connected to the first pocket well 211 through the upper one directional device 212. Thus, the upper string select line voltage Vssl_u can maintain a constant voltage regardless of a coupling to peripheral circuits. For example, the upper string select line voltage Vssl_u may be biased at a voltage lower than the first pocket well voltage Vppw1 by a threshold voltage of a diode. Thus, in an erase operation, the upper string select lines SSLu may be prevented from being erased.

The lower string lines SSLd may be connected to the second pocket well 214 through the lower one directional device 215. Thus, the lower string select line voltage Vssl_d can maintain a constant voltage regardless of a coupling to peripheral circuits. For example, the lower string select line voltage Vssl_d may be biased at a voltage lower than the second pocket well voltage Vppw2 by a threshold voltage of a diode. Thus, in an erase operation, the lower string select lines SSLd may be prevented from being erased.

Figure 14:
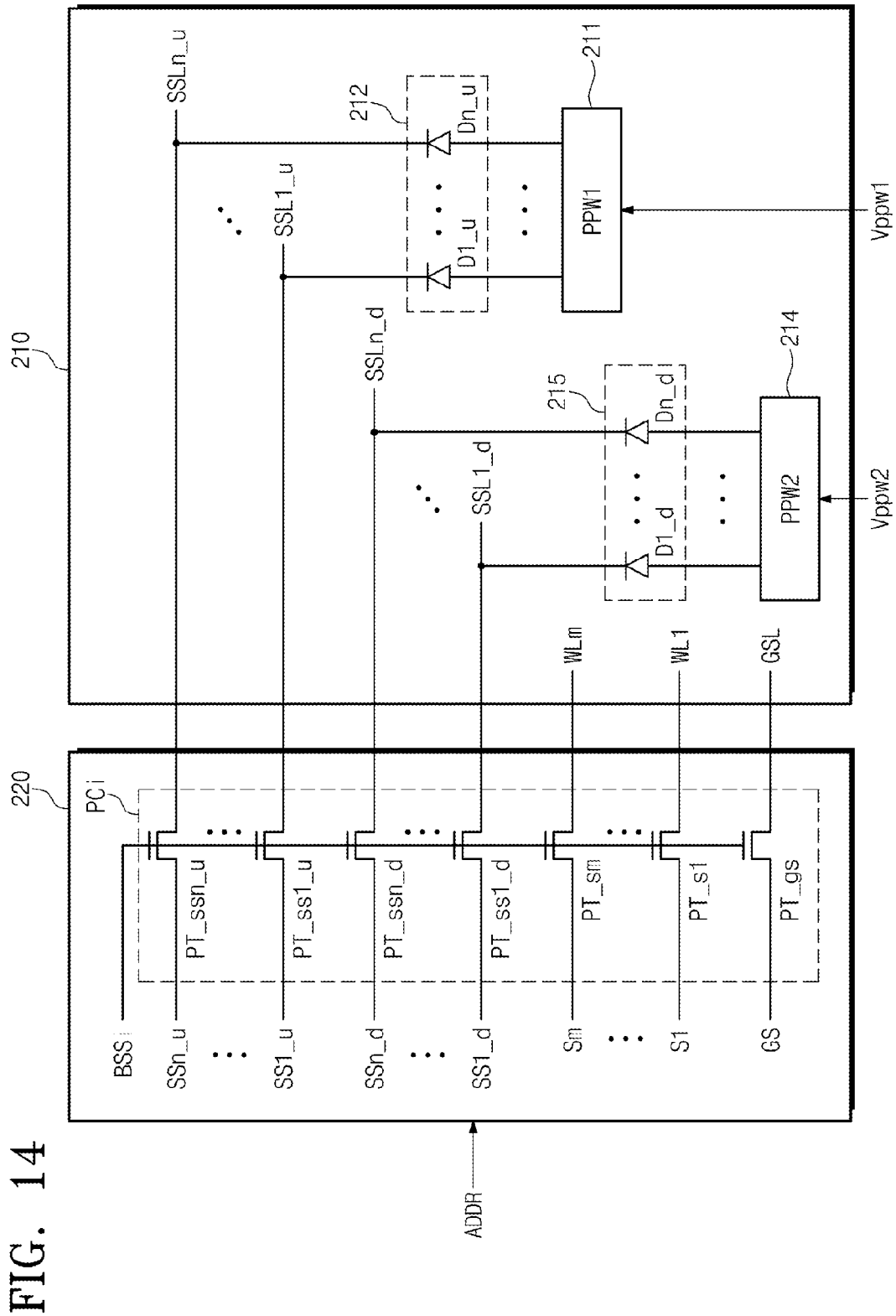
FIG. 14 is a drawing illustrating upper and lower one directional devices of FIG. 12.

FIG. 14 is a drawing illustrating the upper and lower one directional devices of FIG. 12. Referring to FIG. 14, the upper one directional device 212 may include a plurality of upper diodes D1_u~Dn_u. Upper string select lines SSL1_u~SSLn_u may be connected to the first pocket well 211 through the upper diodes D1_u~Dn_u respectively. The lower one directional device 215 may include a plurality of lower diodes D1_d~Dn_d. Lower string select lines SSL1_d~SSLn_d may be connected to the second pocket well 214 through the lower diodes D1_d~Dn_d respectively.

The address decoder 220 may include pass circuits corresponding to memory blocks included in the memory cell array 210. A pass circuit PCi is one of the pass circuits. The pass circuit PCi may include a plurality of pass transistors PT_ss1_u~PT_ssn_u, PT_ss1_d~PT_ssn_d, PT_s1~PT_sm, and PT_gs.

In response to a block select signal BSSi, the pass transistors PT_ss1_u~PT_ssn_u, PT_ss1_d~PT_ssn_d, PT_s1~PT_sm, and PT_gs may connect upper and lower string select lines SSL1_u~SSLn_u and SSL1_d~SSLn_d, word lines WL1~WLm, and a ground select line GSL to upper and lower string lines SS1_u~SSn_u and SS1_d~SSn_d, select lines S1~Sm, and a ground line GS respectively. The pass transistors may be high voltage transistors.

An activated block select signal BSSi may be supplied to the pass circuit PCi corresponding to a selected memory block among the memory blocks BLK1~BLKz. That is, upper and lower string select lines SSL1_u~SSLn_u and SSL1_d~SSLn_d, word lines WL1~WLm, and a ground select line GSL of the selected memory block may be connected to the address decoder 220. In an erase operation, the address decoder 220 may provide a word line erase voltage Vers_wl to the word lines WL1~WLm of the selected memory block. The address decoder 220 can float the string select lines SSL1~SSLn and the ground select line GSL. The address decoder 220 can float the ground select line GSL after specific time has elapsed according to the GSL delayed scheme.

One terminals of the upper diodes D1_u~Dn_u may be connected to the first pocket well 211. For example, anode terminals of the upper diodes D1_u~Dn_u may be connected to the first pocket well 211. The other terminals of upper diodes D1_u~Dn_u may be connected to the upper string select lines SSL1_u~SSLn_u. Cathode terminals of the upper diodes D1_u~Dn_u may be connected to the upper string select lines SSL1_u~SSLn_u. The upper string select lines SSL1_u~SSLn_u may be connected to the upper diodes D1_u~Dn_u respectively. Thus, a current may flow in a direction from the first pocket well 211 toward the upper string select lines SSL1_u~SSLn_u. The upper diodes D1_u~Dn_u may be connected between the pass circuit PCi and the upper string select transistors 213.

One of the terminals of the lower diodes D1_d~Dn_d may be connected to the second pocket well 214. For example, anode terminals of the lower diodes D1_d~Dn_d may be connected to the second pocket well 214. The other terminals of lower diodes D1_d~Dn_d may be connected to the lower string select lines SSL1_d~SSLn_d. Cathode terminals of the lower diodes D1_d~Dn_d may be connected to the lower string select lines SSL1_d~SSLn_d. The lower string select lines SSL1_d~SSLn_d may be connected to the lower diodes D1_d~Dn_d respectively. Thus, a current may flow in a direction from the second pocket well 214 toward the lower string select lines SSL1_d~SSLn_d. The lower diodes D1_d~Dn_d may be connected between the pass circuit PCi and the lower string select transistors 216.

In an erase operation, a first pocket well voltage Vppw1 may be applied to the first pocket well 211. The upper string select lines SSL1_u~SSLn_u may be floated. Thus, a constant upper string select line voltage Vssl_u may be supplied to the upper string select lines SSL1_u~SSLn_u through the upper diodes D1_u~Dn_u. For example, the upper string select line voltage Vssl_u may be a voltage lower than the first pocket well voltage Vppw1 by a threshold voltage of the upper diodes D1_u~Dn_u.

In an erase operation, a second pocket well voltage Vppw2 may be applied to the second pocket well 214. The lower string select lines SSL1_d~SSLn_d may be floated. Thus, a constant lower string select line voltage Vssl_d may be supplied to the lower string select lines SSL1_d~SSLn_d through the lower diodes D1_d~Dn_d. For example, the lower string select line voltage Vssl_d may be a voltage lower than the second pocket well voltage Vppw2 by a threshold voltage of the lower diodes D1_d~Dn_d.

Figure 15:
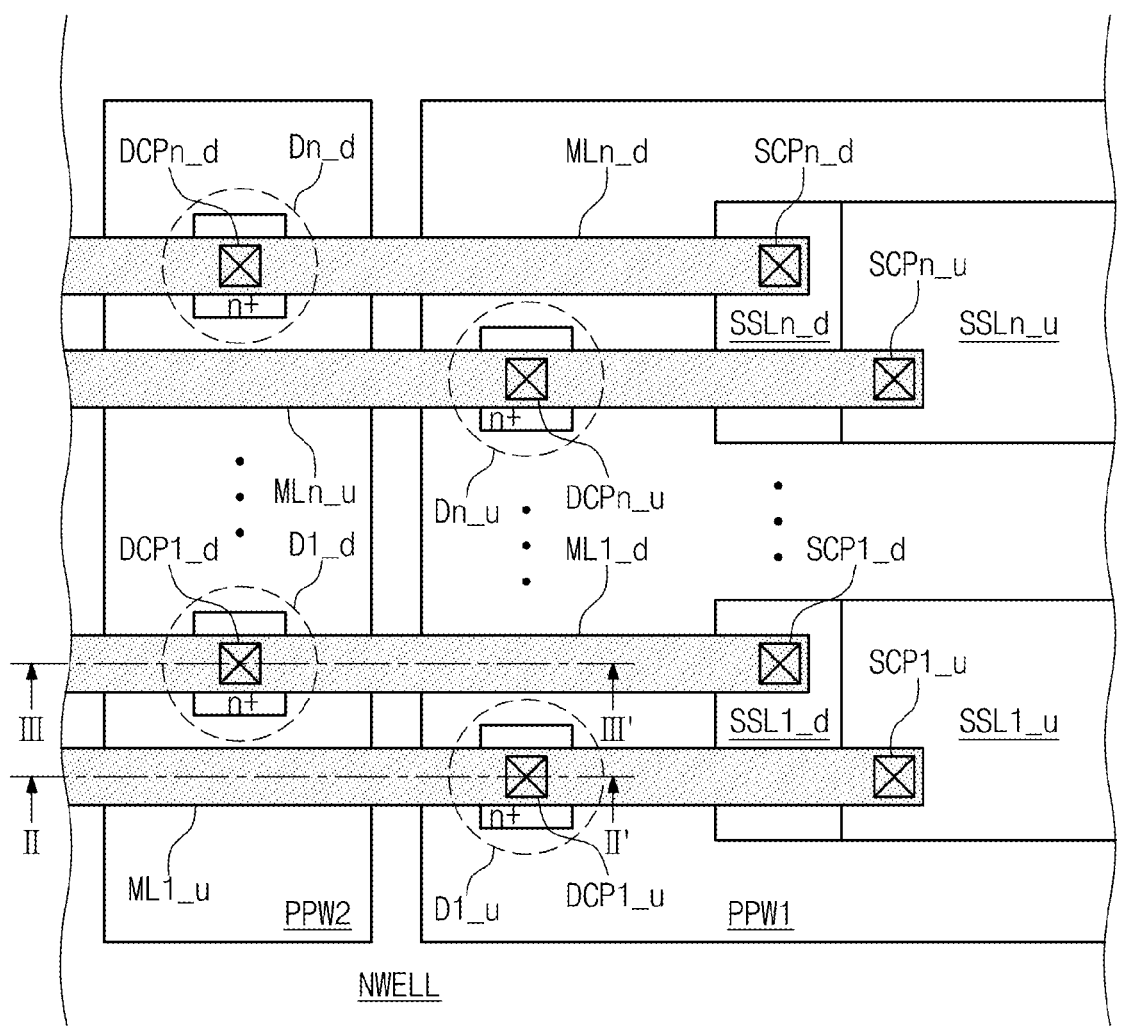
FIG. 15 is a top plan view illustrating an embodiment of the one directional device of FIG. 14.
Figure 16:
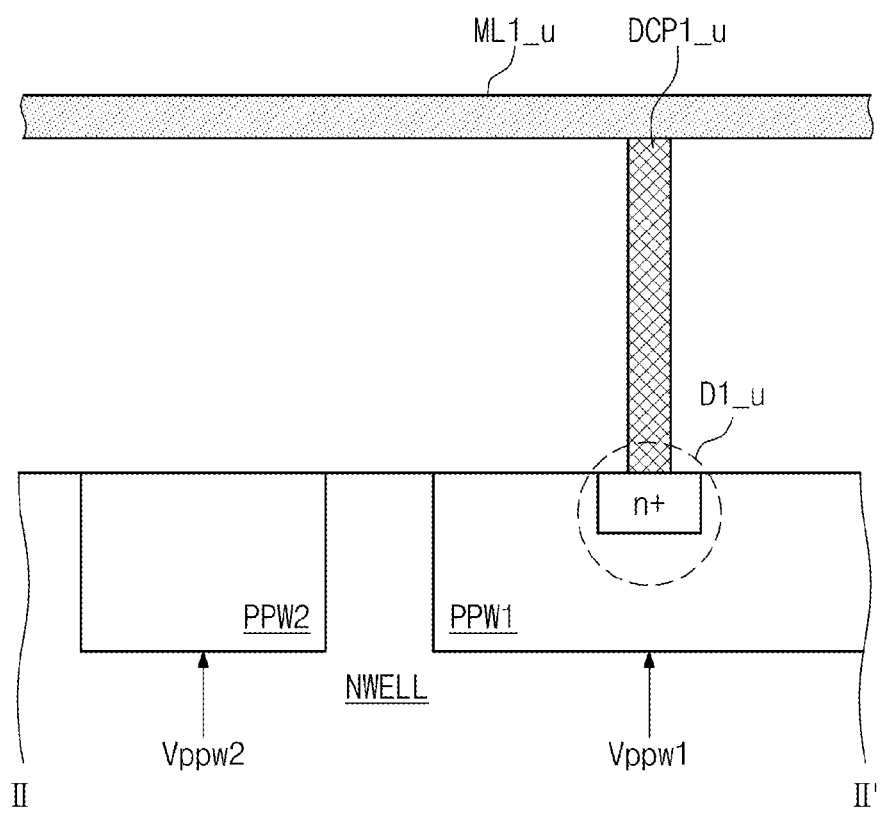
FIG. 16 is a cross sectional view taken along the line II-II' of FIG. 15.
Figure 17:
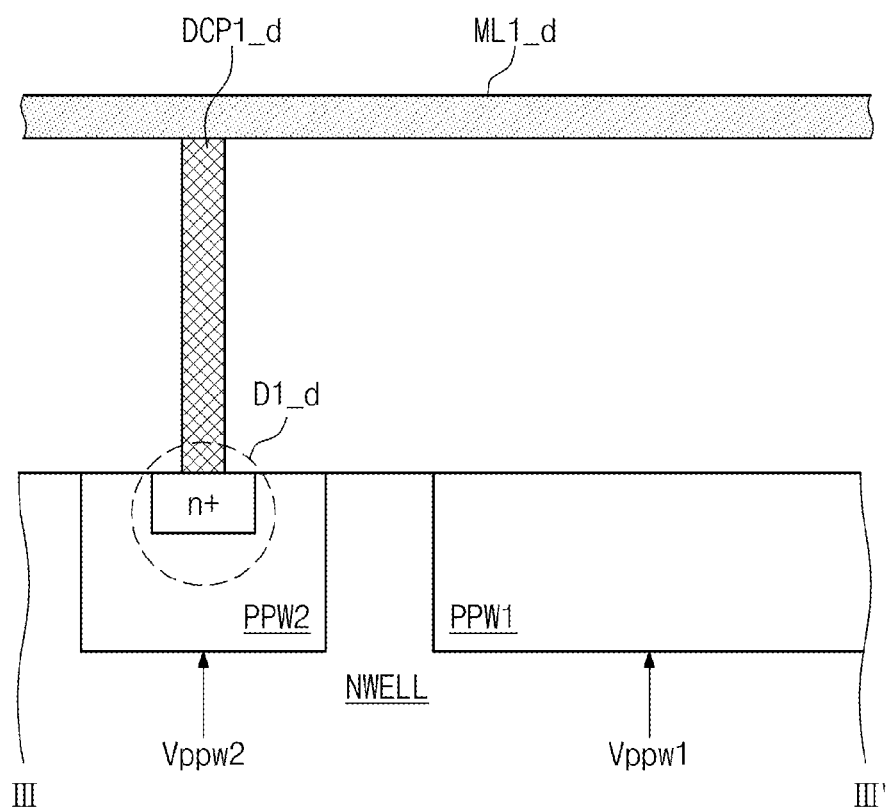
FIG. 17 is a cross sectional view taken along the line III-III' of FIG. 15.

FIG. 15 is a top plan view illustrating an embodiment of the one directional device of FIG. 14. FIG. 16 is a cross sectional view taken along the line II-II' of FIG. 15. FIG. 17 is a cross sectional view taken along the line III-III' of FIG. 15.

Referring to FIGS. 15 through 17, the upper diodes D1_u~Dn_u may be formed by doping an n+ area in the first pocket well PPW1. The lower diodes D1_d~Dn_d may be formed by doping an n+ area in the second pocket well PPW2 separated from the first pocket well PPW1. The first and second pocket wells PPW1 and PPW2 may be formed on an N well NWELL. The first and second pocket wells PPW1 and PPW2 may also be formed to be separated from each other. Thus, the first and second pocket wells PPW1 and PPW2 may be supplied with different voltages respectively.

The upper and lower string select lines SSL1_u~SSLn_u and SSL1_d~SSLn_d may be formed on the first pocket well PPW1. Although not illustrated, the word lines WL and the ground select line GSL may be stacked between the lower string select lines SSL1_d~SSLn_d and the first pocket well PPW1 to be formed.

The upper string select lines SSL1_u~SSLn_u may be connected to upper conductive lines ML1_u~MLn_u respectively. For example, the upper string select line SSL1_u may be connected to the upper conductive line ML1_u through an upper SSL connection plug SCP1_u. The upper string select line SSLn_u may be connected to the upper conductive line MLn_u through an upper SSL connection plug SCPn_u. The upper conductive lines ML1_u~MLn_u may extend to be connected to the pass circuit PCi of the address decoder 220.

The lower string select lines SSL1_d~SSLn_d may be connected to lower conductive lines ML1_d~MLn_d respectively. For example, the lower string select line SSL1_d may be connected to the lower conductive line ML1_d through a lower SSL connection plug SCP1_d. The lower string select line SSLn_d may be connected to the lower conductive line MLn_d through a lower SSL connection plug SCPn_d. The lower conductive lines ML1_d~MLn_d may extend to be connected to the pass circuit PCi of the address decoder 220.

A plurality of n+ areas may be doped on the first pocket well PPW1 in which the upper and lower string select lines SSL1_u~SSLn_u and SSL1_d~SSLn_d are stacked. The n+ area doped on the first pocket well PPW1 may operate as a diode. Thus, the n+ areas may form the upper diodes D1_u~Dn_u.

The upper diodes D1_u~Dn_u may be connected to the upper conductive lines ML1_u~MLn_u respectively. For example, the upper diode D1_u may be connected to the upper conductive line ML1_u through an upper diode connection plug DCP1_u. The upper diode Dn_u may be connected to the upper conductive line MLn_u through an upper diode connection plug DCPn_u. The upper diodes D1_u~Dn_u may be formed on the first pocket well PPW1 to be turned on by the first pocket well voltage Vppw1 in an erase operation.

A plurality of n+ areas may be doped on the second pocket well PPW2 separated from the first pocket well PPW1. The n+ areas doped on the second pocket well PPW2 may operate as a diode. Thus, the n+ areas may form the lower diodes D1_d~Dn_d.

The lower diodes D1_d~Dn_d may be connected to the lower conductive lines ML1_d~MLn_d respectively. For example, the lower diode D1_d may be connected to the lower conductive line ML1_d through a lower diode connection plug DCP1_d. The lower diode Dn_d may be connected to the lower conductive line MLn_d through a lower diode connection plug DCPn_d. The lower diodes D1_d~Dn_d may be formed on the second pocket well PPW2 to be turned on by the second pocket well voltage Vppw2 in an erase operation.

Thus, in an erase operation, the upper and lower string select lines SSL1_u~SSLn_u and SSL1_d~SSLn_d may be biased at different voltages respectively.

Figure 18:
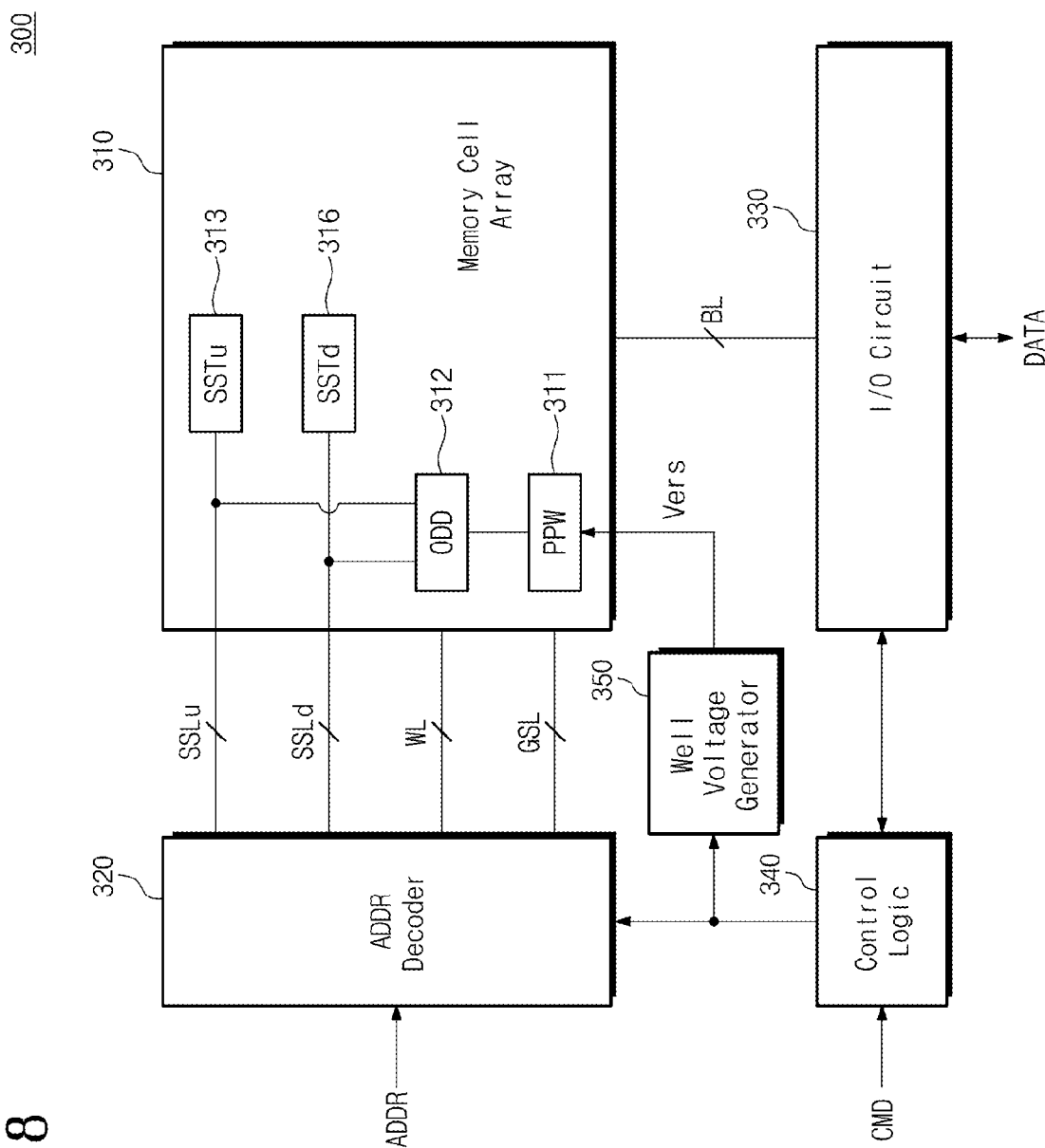
FIG. 18 is a block diagram illustrating a nonvolatile memory device in accordance with a third embodiment of the inventive concept.

FIG. 18 is a block diagram illustrating a nonvolatile memory device in accordance with a third embodiment of the inventive concept. Referring to FIG. 18, a nonvolatile memory device 300 may include a memory cell array 310, an address decoder 320, an input/output circuit 330, control logic 340, and a well voltage generator 350. Since a basic constitution of the nonvolatile memory device 300 is similar or the same as that of the nonvolatile memory device 100 of FIG. 7, a description thereof is omitted.

The memory cell array 300 may include upper string select transistors 313 and lower string select transistors 316. The upper string select transistors 313 may be connected to the address decoder 320 through upper string select lines SSLu. The lower string select transistors 316 may be connected to the address decoder 320 through lower string select lines SSLd.

The upper and lower string select lines SSLu and SSLd may be connected to a pocket well 311 through a one directional device 312. The one directional device 312 may include a plurality of diodes. The upper string select lines SSLu may be connected to the pocket well 311 through the diodes. For example, the diodes may be connected so that a current flows from the pocket well 311 toward the string select lines SSLu and SSLd. Thus, in the case that a voltage of the first pocket well 311 is higher than that of the string select lines SSLu and SSLd, the diodes may be turned on. The lower string select line SSLd connected to the same memory as the upper string select line SSLu may be connected to a diode in parallel to which the upper string select line SSLu is connected.

In an erase operation, an erase voltage which is a high voltage may be applied to the pocket well 311. The upper and lower string select lines SSLu and SSLd may be floated. Thus, diodes of the one directional device 312 may be turned on and a voltage lower than the erase voltage Vers by a threshold voltage of the diode may be supplied to the upper and lower string select lines SSLu and SSLd. Thus, the upper and lower string select lines SSLu and SSLd are biased at a voltage state higher than the erase condition voltage Vers_con (refer to FIG. 6), thereby preventing the upper and lower string select transistors 313 and 316 from being erased.

The well voltage generator 350 may operate according to a control of the control logic 340. The well voltage generator 350 may be configured to generate a high voltage. For example, in an erase operation, an erase voltage Vers generated by the well voltage generator 350 may be transferred to the pocket well 311 of the memory cell array 310.

Figure 19:
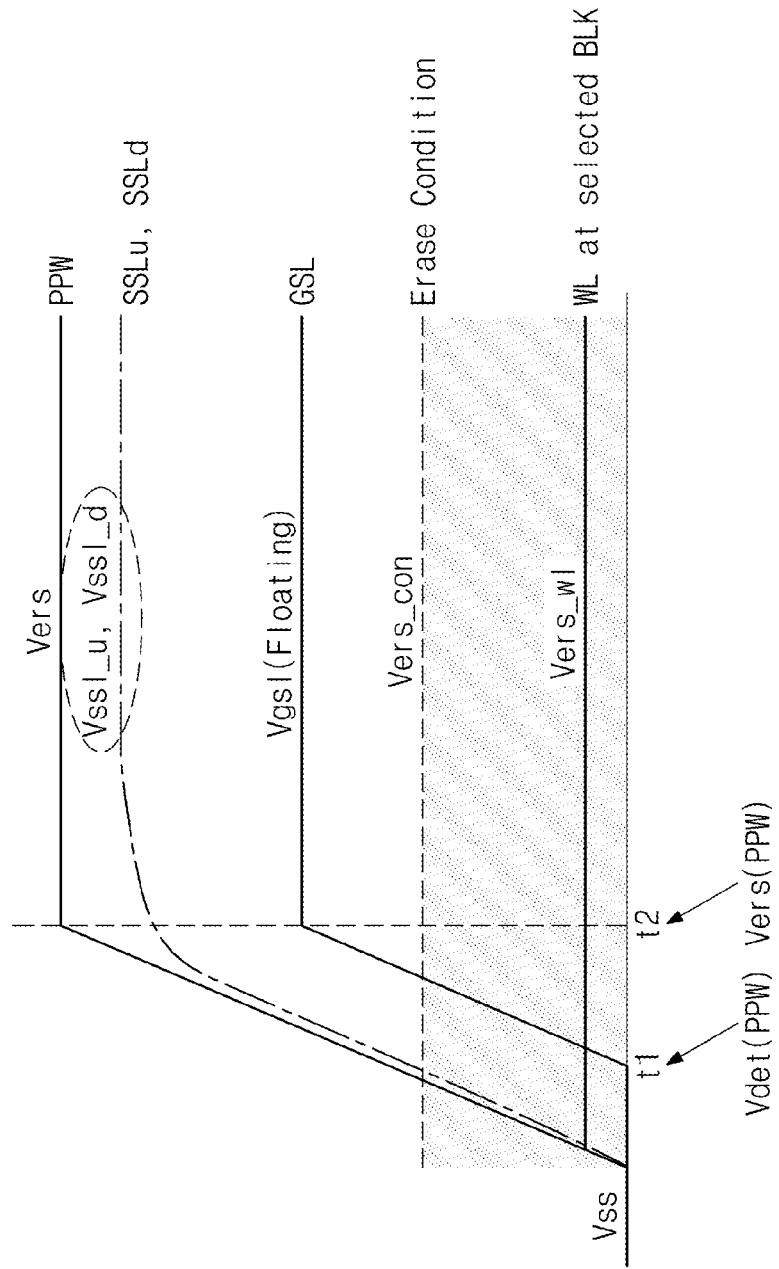
FIG. 19 is a timing diagram illustrating a voltage bias in an erase operation of the nonvolatile memory device of FIG. 18.

FIG. 19 is a timing diagram illustrating a voltage bias in an erase operation of the nonvolatile memory device of FIG. 18. Referring to FIGS. 18 and 19, in an erase operation, the upper and lower string select line voltages Vssl_u and Vssl_d may be formed to be higher than the erase condition voltage Vers_con. Since a basic setting of a voltage bias of FIG. 19 is similar or the same as that of the voltage bias of FIG. 6, a description thereof is omitted.

The string select lines SSL may be connected to the pocket well 311 through the one way directional device 312. Thus, the upper and lower string select line voltages Vssl_u and Vssl_d can maintain a constant voltage regardless of a coupling to peripheral circuits. For example, the upper and lower string select line voltages Vssl_u and Vssl_d can be biased at a voltage lower than the erase voltage Vers by a threshold voltage of a diode. Thus, in an erase operation, the upper and lower string select line voltages Vssl_u and Vssl_d may be prevented from being erased. The upper and lower string select lines SSLu and SSLd connected to the same memory cell may be biased at the same voltage.

Figure 20:
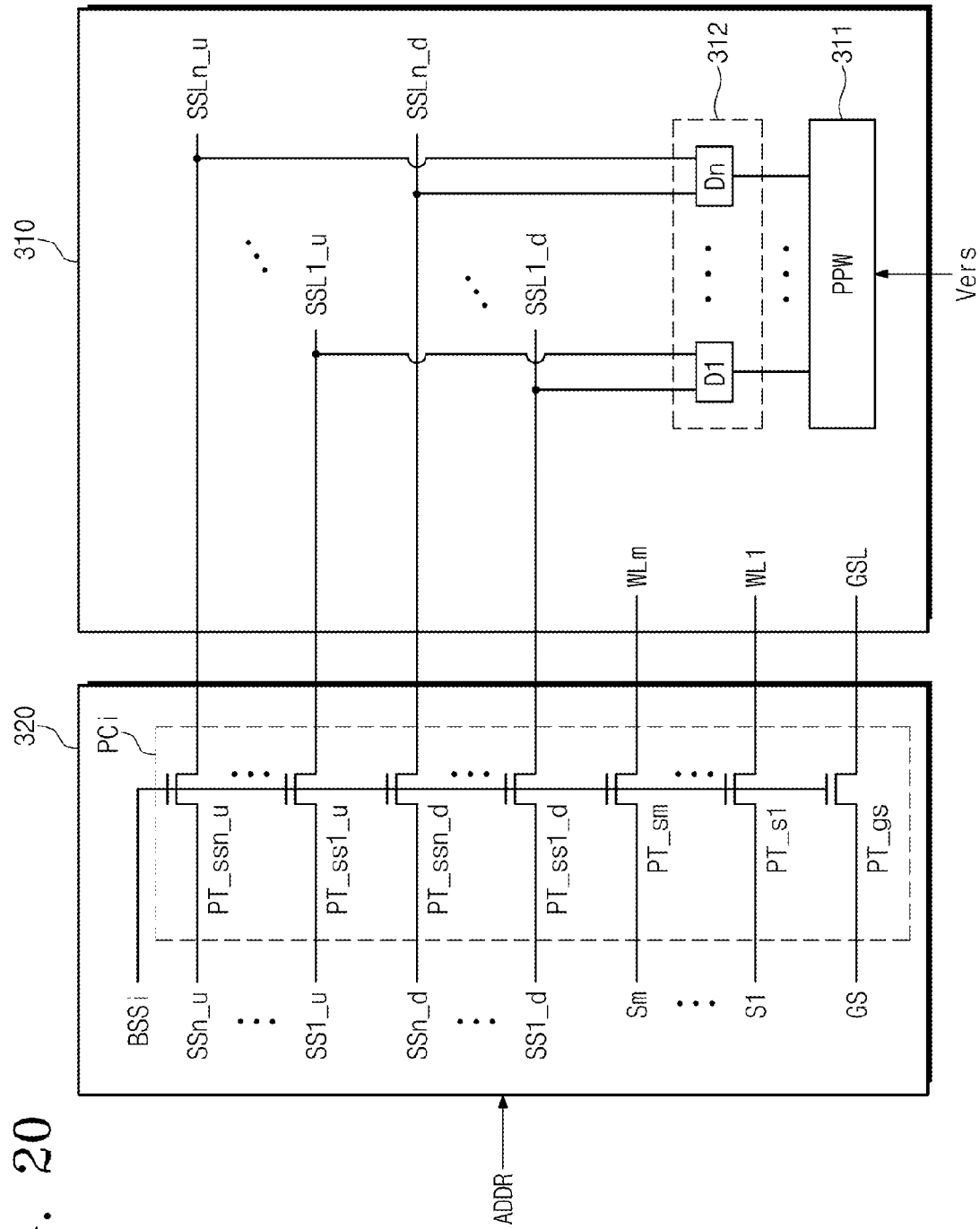
FIG. 20 is a drawing illustrating a one directional device of FIG. 18.

FIG. 20 is a drawing illustrating the one directional device of FIG. 18. Referring to FIG. 20, the one directional device 312 may include a plurality of diodes D1~Dn. The upper string select lines SSL1_u~SSLn_u may be connected to the pocket well 311 through the diodes D1~Dn respectively. The lower string select lines SSL1_d~SSLn_d may be connected to the pocket well 311 through the diodes D1~Dn respectively. The upper and lower string select lines being to the same memory may be connected to the same diode in parallel. For example, the first upper and lower string select lines SSL1_u and SSL1_d may be connected to the diode D1 in parallel. The nth upper and lower string select lines SSLn_u and SSLn_d may be connected to the diode Dn in parallel.

Since a structure of the address decoder 320 is the same or similar to that of the address decoder 220 of FIG. 14, a description thereof is omitted.

One of the terminals of the diodes D1~Dn may be connected to the pocket well 311. For example, anode terminals of the diodes D1~Dn may be connected to the pocket well 311. The other terminals of diodes D1~Dn may be connected to the upper and lower string select lines SSL1_$u$~SSLn_u and SSL1_$d$~SSLn_d. Cathode terminals of diodes D1~Dn may be connected to the upper and lower string select lines SSL1_$u$~SSLn_u and SSL1_$d$~SSLn_d. Thus, a current may flow in a direction from the pocket well 311 toward the upper and lower string select lines SSL1_$u$~SSLn_u and SSL1_$d$~SSLn_d. The diodes D1~Dn may be connected between the pass circuit PCi and the upper and lower string select transistors 313 and 316.

In an erase operation, an erase voltage Vers may be applied to the pocket well 311. The upper and lower string select lines SSL1_$u$~SSLn_u and SSL1_$d$~SSLn_d may be floated. Thus, constant upper and lower string select line voltages Vssl_u and Vssl_d may be applied to the upper and lower string select lines SSL1_$u$~SSLn_u and SSL1_$d$~SSLn_d through the diodes D1~Dn. For example, the upper and lower string select line voltages Vssl_u and Vssl_d may be voltages lower than the erase voltage Vers by a threshold voltage of the diodes D1~Dn.

Figure 21:
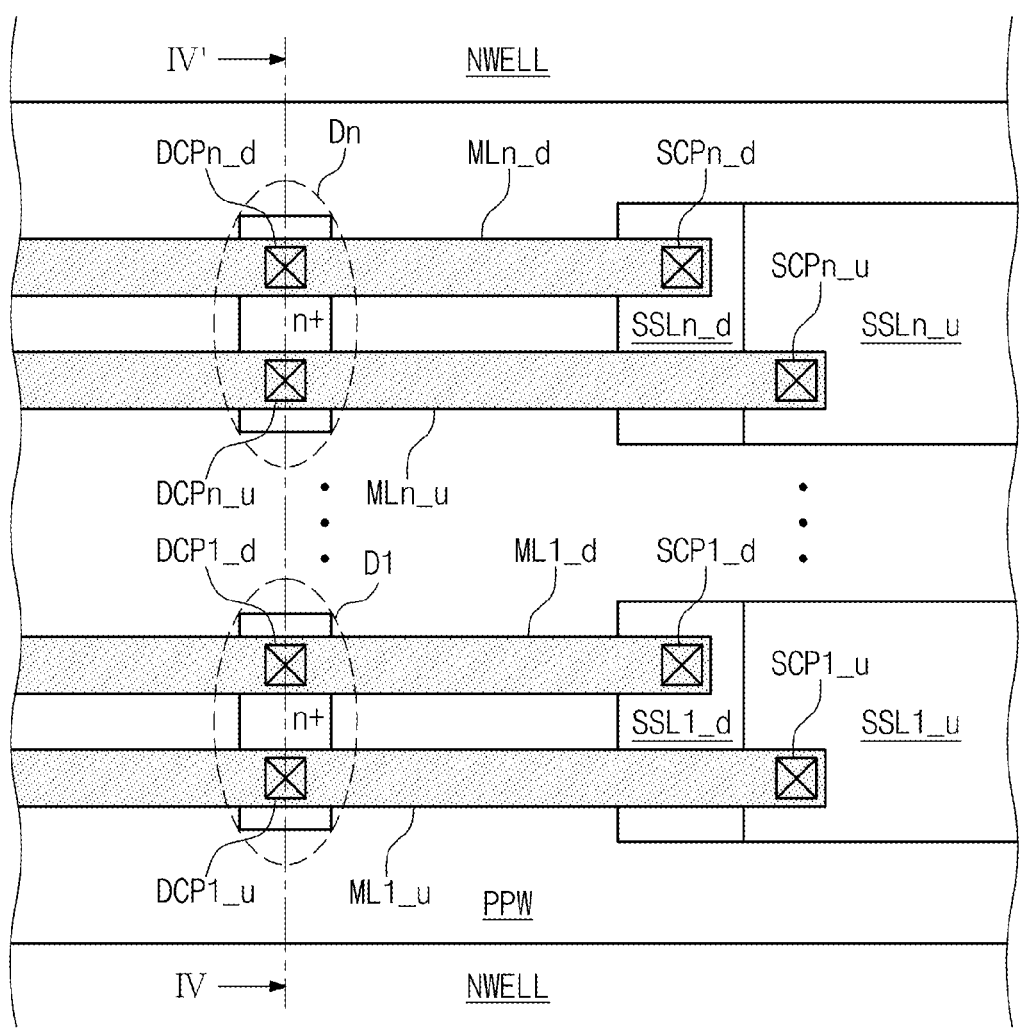
FIG. 21 is a top plan view illustrating an embodiment of the one directional device of FIG. 20.
Figure 22:
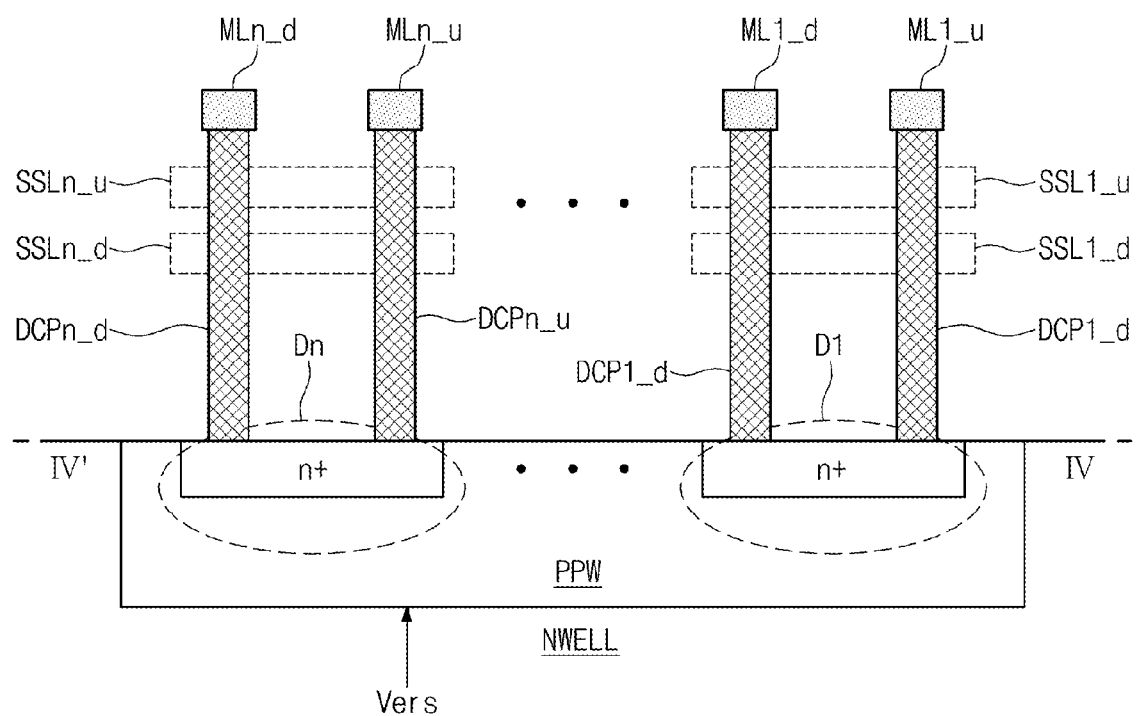
FIG. 22 is a cross sectional view taken along the line IV-IV' of FIG. 21.

FIG. 21 is a top plan view illustrating an embodiment of the one directional device of FIG. 20. FIG. 22 is a cross sectional view taken along the line IV-IV' of FIG. 21. Referring to FIGS. 20 through 22, the diodes D1~Dn may be formed by doping an n+ area in the pocket well PPW.

The pocket well PPW may be formed on the N well NWELL. The upper and lower string select lines SSL1_$u$~SSLn_u and SSL1_$d$~SSLn_d may be formed on the pocket well PPW. Although not illustrated, word lines WL and a ground select line GSL may be stacked between the lower string select lines SSL1_$d$~SSLn_d and the pocket well PPW to be formed.

The upper string select lines SSL1_$u$~SSLn_u may be connected to upper conductive lines ML1_$u$~MLn_u respectively. For example, the upper string select line SSL1_$u$ may be connected to the upper conductive line ML1_$u$ through an upper SSL connection plug SCP1_$u$. The upper string select line SSLn_u may be connected to the upper conductive line MLn_u through an upper SSL connection plug SCPn_$u$. The upper conductive lines ML1_$u$~MLn_u may be extended to be connected to the pass circuit PCi of the address decoder 320.

The lower string select lines SSL1_$d$~SSLn_d may be connected to lower conductive lines ML1_$d$~MLn_d respectively. For example, the lower string select line SSL1_$d$ may be connected to the lower conductive line ML1_$d$ through a lower SSL connection plug SCP1_$d$. The lower string select line SSLn_d may be connected to the lower conductive line MLn_d through a lower SSL connection plug SCPn_$d$. The lower conductive lines ML1_$d$~MLn_d may be extended to be connected to the pass circuit PCi of the address decoder 320.

A plurality of n+ areas may be doped on the pocket well PPW on which the string select lines SSL1~SSLn are stacked. The n+ area doped on the pocket well may operate as a diode. Thus, the n+ areas may form diodes D1~Dn.

The diodes D1~Dn may be connected to upper and lower conductive lines ML1_$u$~MLn_u and ML1_$d$~MLn_d respectively. For example, the diode D1 may be connected to the upper conductive line ML1_$u$ through an upper diode connection plug DCP1_$u$. The diode D1 may be connected to the lower conductive line ML1_$d$ through a lower diode connection plug DCP1_$d$. The diode Dn may be connected to the upper conductive line MLn_u through an upper diode connection plug DCPn_u. The diode Dn may be connected to the lower conductive line MLn_d through a lower diode connection plug DCPn_d. The diodes D1~Dn may be formed on the pocket well PPW to be turned on by an erase voltage Vers in an erase operation.

Figure 23:
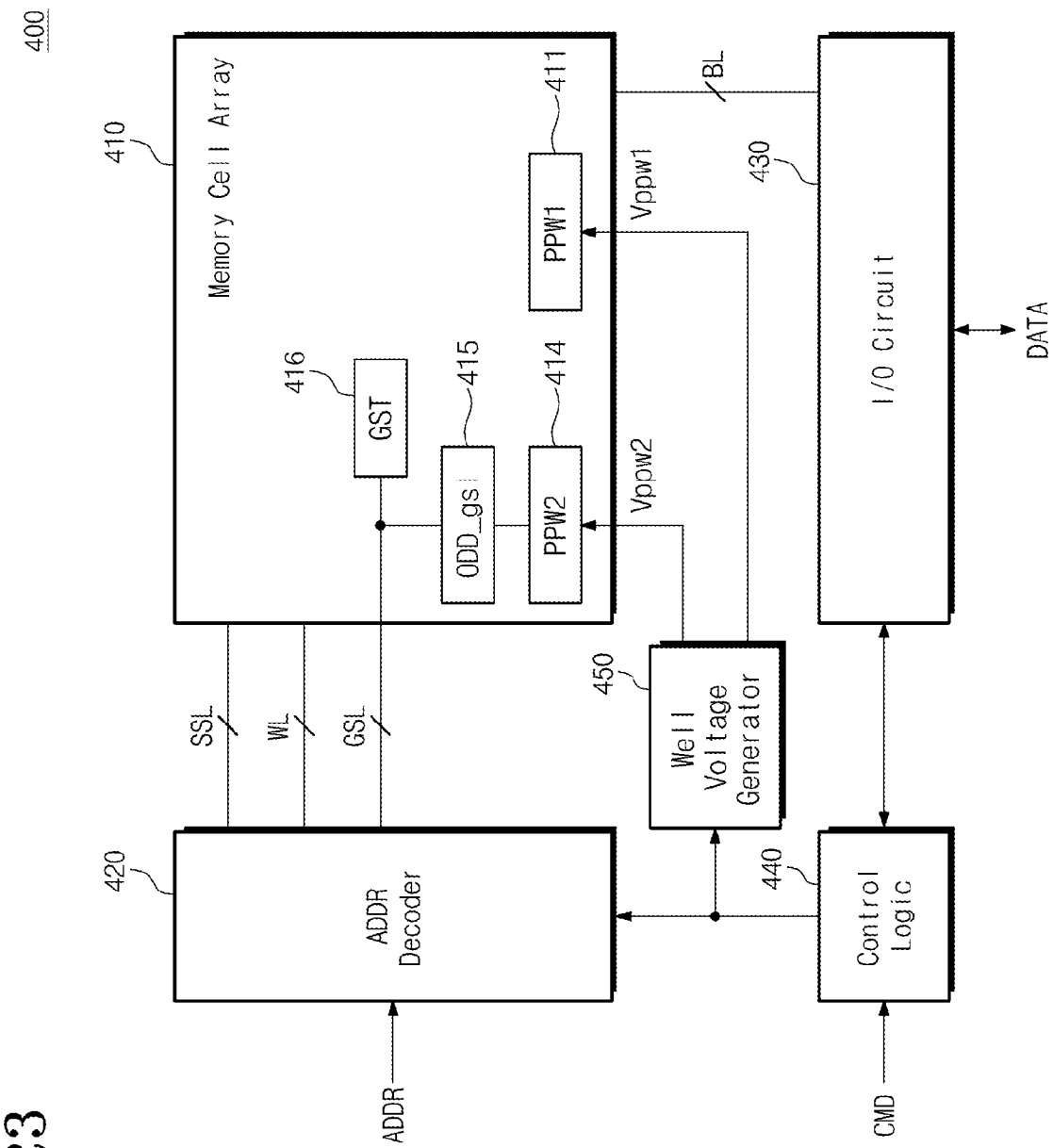
FIG. 23 is a block diagram illustrating a nonvolatile memory device in accordance with a fourth embodiment of the inventive concept.

FIG. 23 is a block diagram illustrating a nonvolatile memory device in accordance with a fourth embodiment of the inventive concept. Referring to FIG. 23, a nonvolatile memory device 400 may include a memory cell array 410, an address decoder 420, an input/output circuit 430, control logic 440, and a well voltage generator 450. Since a basic constitution of the nonvolatile memory device 400 is similar or the same as that of the nonvolatile memory device 100 of FIG. 7, a description thereof is omitted.

The memory cell array 410 may include a plurality of ground select transistors 416. The ground select transistors 416 may be connected to the address decoder 420 through one or more ground select lines GSL.

The memory cell array 410 may include a first pocket well 411 and a second pocket well 414. For example, the first and second pocket wells 411 and 414 may be formed to be separated from each other. Memory cells may be stacked on the first pocket well 411 to be formed.

The ground select lines GSL may be connected to the second pocket well 414 through a ground select line one directional device 415. The ground select line one directional device 415 may include a plurality of ground select line diodes. The ground select lines GSL may be connected to the second pocket well 414 through the ground select line diodes respectively. For example, the ground select line diodes may be connected so that a current flows from the second pocket well 414 toward the ground select lines GSL. Thus, in the case that a voltage of the second pocket well 414 is higher than those of the ground select lines GSL, the ground select line diodes may be turned on.

In an erase operation, a second pocket well voltage Vppw2 may be applied to the second pocket well 414. The second pocket well voltage Vppw2 is different from a first pocket well voltage Vppw1. The ground select lines GSL may be floated. Thus, the ground select line diodes may be turned on and a voltage lower than the second pocket well voltage Vppw2 by a threshold voltage of the diode may be supplied. Thus, the ground select lines GSL are biased at a voltage higher than the erase condition voltage Vers_con (refer to FIG. 13), thereby preventing ground select transistors from being erased. Using the second pocket well voltage Vppw2, the ground select lines GSL may be maintained at a voltage different from the first pocket well voltage Vppw1. For example, the first pocket well voltage Vppw1 may be the erase voltage Vers.

The control logic 440 can control the well voltage generator 450 so that different voltages are supplied to the first and second pocket wells 411 and 414 respectively. The well voltage generator 450 can operate according to a control of the control logic 440. The well voltage generator 450 may be configured to generate a high voltage. For example, in an erase operation, the first and second pocket well voltages Vppw1 and Vppw2 generated by the well voltage generator 450 may be applied to the first and second pocket wells 411 and 414 of the memory cell array 410. The first pocket well voltage Vppw1 may be the erase voltage Vers. The second pocket well voltage Vppw2 may be lower than the first pocket well voltage Vppw1.

Figure 24:
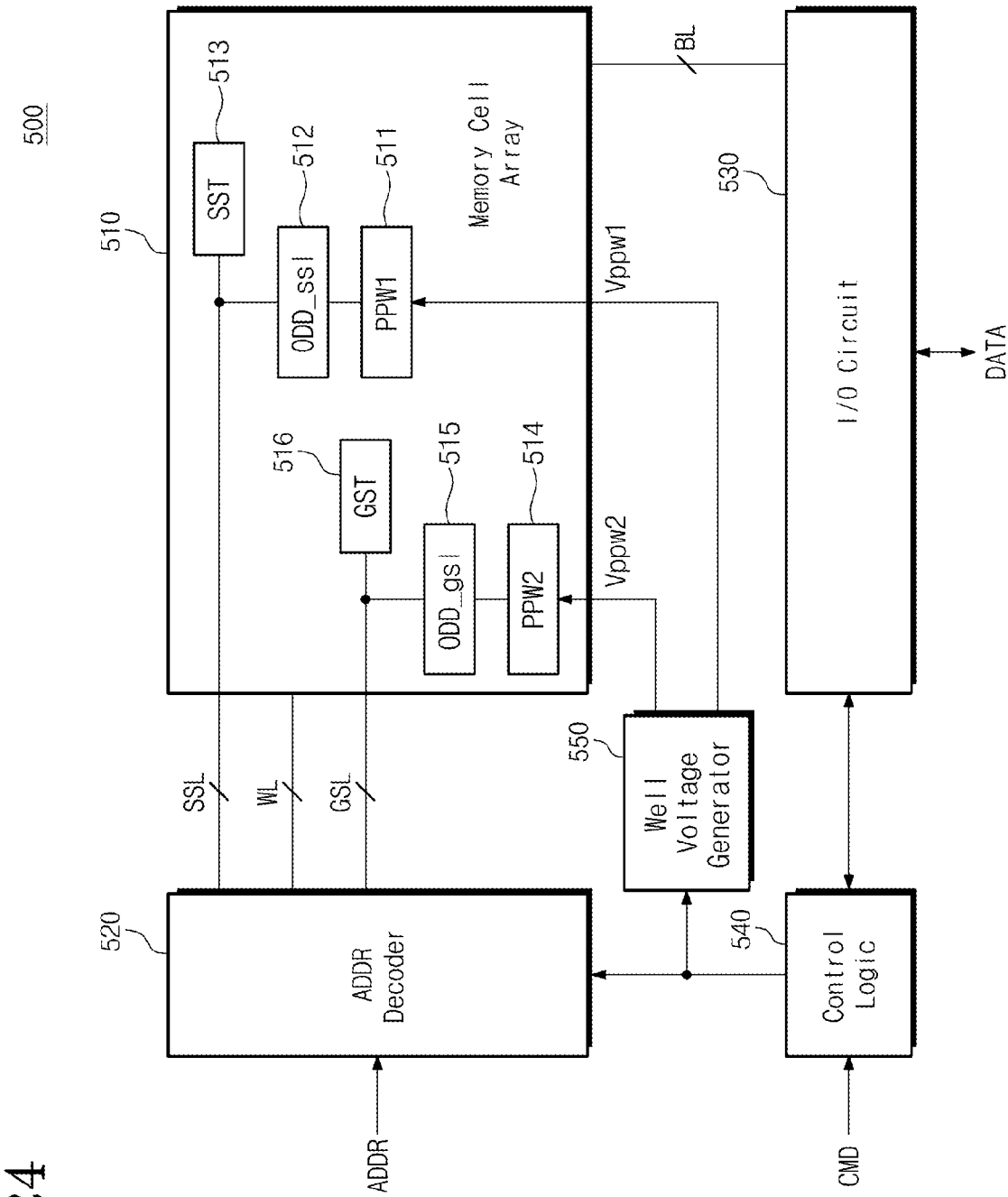
FIG. 24 is a block diagram illustrating a nonvolatile memory device in accordance with a fifth embodiment of the inventive concept.

FIG. 24 is a block diagram illustrating a nonvolatile memory device in accordance with a fifth embodiment of the inventive concept. Referring to FIG. 24, a nonvolatile memory device 500 may include a memory cell array 510, an address decoder 520, an input/output circuit 530, control logic 540, and a well voltage generator 550. Since a basic constitution of the nonvolatile memory device 500 is similar or the same as that of the nonvolatile memory device 100 of FIG. 7, a description thereof is omitted.

The memory cell array 510 may include string select transistors 513 and ground select transistors 516. The string select transistors 513 may be connected to the address decoder 520 through string select lines SSL. The ground select transistors 516 may be connected to the address decoder 520 through ground select lines GSL.

The memory cell array 510 may include a first pocket well 511 and a second pocket well 514. For example, the first and second pocket wells 511 and 514 may be formed to be separated from each other. Memory cells may be stacked on the first pocket well 511 to be formed.

The string select lines SSL may be connected to the first pocket well 511 through a string select line one directional device 512. The string select line one directional device 512 may include a plurality of string select line diodes. The string select lines SSL may be connected to the first pocket well 511 through the string select line diodes respectively. For example, the string select line diodes may be connected so that a current flows from the first pocket well 511 toward the string select lines SSL. Thus, in the case that a voltage of the first pocket well 515 is higher than those of the string select lines SSL, the string select line diodes may be turned on.

The ground select lines GSL may be connected to the second pocket well 514 through a ground select line one directional device 515. The ground select line one directional device 515 may include a plurality of ground select line diodes. The ground select lines GSL may be connected to the second pocket well 515 through the ground select line diodes respectively. For example, the ground select line diodes may be connected so that a current flows from the second pocket well 514 toward the ground select lines GSL. Thus, in the case that a voltage of the second pocket well 514 is higher than those of the ground select lines GSL, the ground select line diodes may be turned on.

In an erase operation, a first pocket well voltage Vppw1 may be applied to the first pocket well 511. The first pocket well voltage Vppw1 may be an erase voltage Vers which is a high voltage. The string select lines SSL may be floated. Thus, the string select line diodes may be turned on and a voltage lower than the first pocket well voltage Vppw1 by threshold voltages of the string select line diodes may be supplied. Thus, the string select lines SSL are biased at a voltage higher than the erase condition voltage Vers_con (refer to FIG. 13), thereby preventing string select transistors 513 from being erased.

In an erase operation, a second pocket well voltage Vppw2 may be applied to the second pocket well 514. The second pocket well voltage Vppw2 is different from a first pocket well voltage Vppw1. The ground select lines GSL may be floated. Thus, the ground select line diodes may be turned on and a voltage lower than the second pocket well voltage Vppw2 by threshold voltages of the ground select line diodes may be supplied. Thus, the ground select lines GSL are biased at a voltage higher than the erase condition voltage Vers_con, thereby preventing ground select transistors from being erased. Using the second pocket well voltage Vppw2, the ground select lines GSL may be maintained at a voltage different from that of the string select lines SSL.

The control logic 540 can control the well voltage generator 550 so that different voltages are supplied to the first and second pocket wells 511 and 514 respectively. The well voltage generator 550 can operate according to a control of the control logic 540. The well voltage generator 550 may be configured to generate a high voltage. For example, in an erase operation, the first and second pocket well voltages Vppw1 and Vppw2 generated by the well voltage generator 550 may be applied to the first and second pocket wells 511 and 514 of the memory cell array 510. The first pocket well voltage Vppw1 may be the erase voltage Vers. The second pocket well voltage Vppw2 may be lower than the first pocket well voltage Vppw1.

Figure 25:
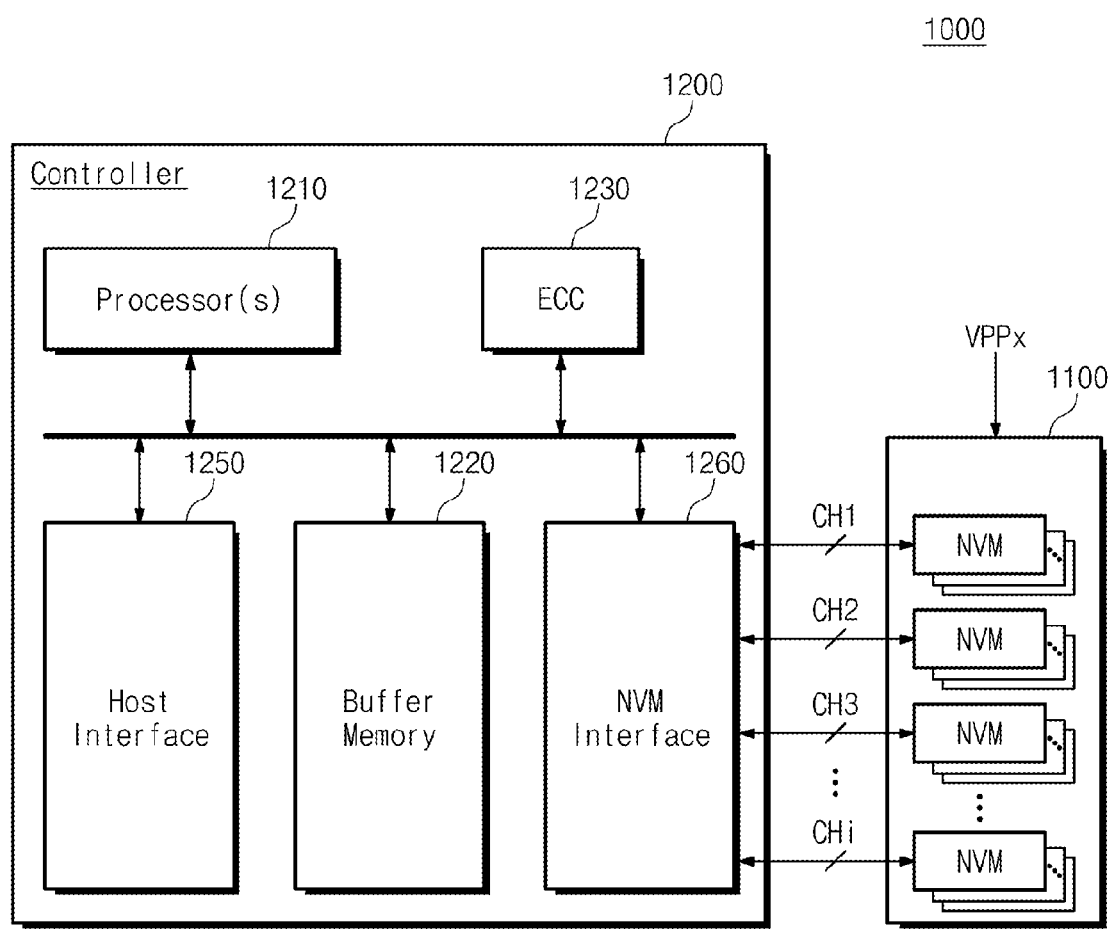
FIG. 25 is a block diagram illustrating an SSD in accordance with some embodiments of the inventive concept.

The inventive concept is capable of being applied to a solid state drive SSD. FIG. 25 is a block diagram illustrating a SSD in accordance with some embodiments of the inventive concept. Referring to FIG. 25, a SSD 1000 may include a plurality of nonvolatile memory devices 1100 and a SSD controller 1200.

The nonvolatile memory devices 1100 may be embodied to selectively receive an external high voltage Vpp. As described in FIGS. 1 through 24, in each of the nonvolatile memory devices 1100, string select lines or ground select lines may be connected to a pocket well through a one directional device. Thus, in an erase operation, the nonvolatile memory devices 1100 can supply a constant voltage to the string select lines or the ground select lines, thereby preventing string select transistors or ground select transistors from being erased.

The SSD controller 1200 is connected to the nonvolatile memory devices 1100 through a plurality of channels CH1~CHi (i is an integer more than 2). The SSD controller 1200 may include at least one processor 1210, a buffer memory 1220, an error correction circuit 1230, a host interface 1250, and a nonvolatile memory interface 1260.

The buffer memory 1220 temporarily stores data needed to drive the memory controller 1200. The buffer memory 1220 may include a plurality of memory lines storing data or a command. The memory lines may be mapped to cache lines 1212 using various methods.

The error correction circuit 1230 can calculate an error correction code to be programmed in a write operation, correct an error of data read in a read operation on the basis of an error correction code value, and correct an error of data restored from the nonvolatile memory device 1100 in a data restoration operation. Although not illustrated, a code memory storing code data needed to drive the memory controller 1200 may be further included. The code memory may be embodied by a nonvolatile memory device.

The host interface 1250 may provide an interface with an external device. The host interface 1250 may be a NAND interface. The nonvolatile memory interface 1260 may provide an interface function with the nonvolatile memory device 1100.

Figure 26:
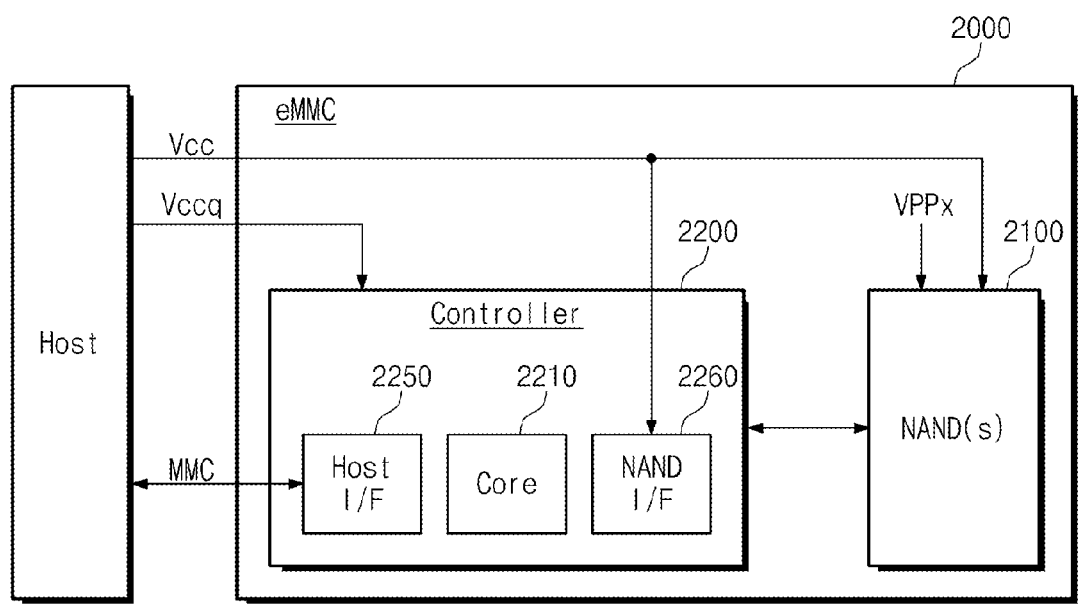
FIG. 26 is a block diagram illustrating an eMMC in accordance with some embodiments of the inventive concept.

The inventive concept is capable of being applied to an EMMC (embedded multimedia card, moviNAND, iNAND). FIG. 26 is a block diagram illustrating an eMMC in accordance with some embodiments of the inventive concept. Referring to FIG. 26, eMMC 2000 may include at least one NAND flash memory devices 2100 and a controller 2200.

The NAND flash memory device 2100 may be a SDR (single data rate) NAND or a DDR (double data rate) NAND. The NAND flash memory devices 2100 may also be a vertical NAND (VNAND). As described in FIGS. 1 Through 24, in the NAND flash memory devices 2100, string select lines or ground select lines may be connected to a pocket well through a one direction device. Thus, in an erase operation, the NAND flash memory devices 2100 can provide a constant voltage to the string select lines or the ground select lines, thereby preventing string select transistors or ground select transistors from being erased.

The controller 2200 may be connected to the NAND flash memory devices 2100 through a plurality of channels. The controller 2200 may include at least one controller core 2210, a host interface 2250, and a NAND interface 2260. The controller core 2210 can control an overall operation of the eMMC 2000. The host interface 2250 can perform an interface between the controller 2210 and a host. The NAND interface 2260 performs the NAND flash memory device 2100 and the controller 2200. The host interface 2250 may be a parallel interface (for example, MMC interface). The host interface 2250 may a serial interface (for example, UHS-II, UFS interface).

The eMMC 2000 can be provided with power supply voltages (Vcc, Vccq) from the host. A first power supply voltage Vcc (3.3.V) may be provided to the NAND flash memory device 2100 and the NAND interface 2260, and a second power supply voltage Vccq (1.8V/3.3V) may be provided to the controller 2200. The EMMC 2000 may be selectively provided with an external high voltage Vpp.

Figure 27:
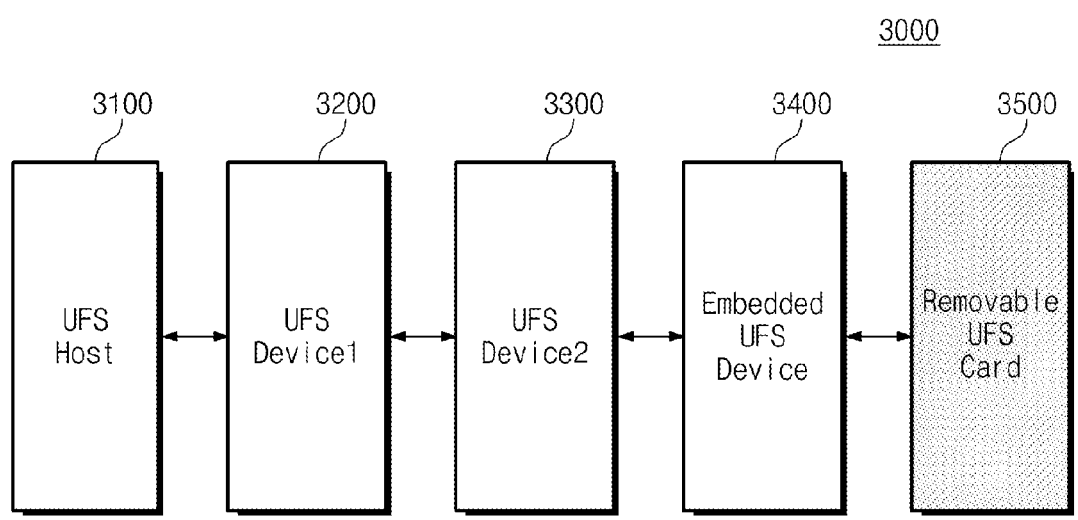
FIG. 27 is a block diagram illustrating a UFS system in accordance with some embodiments of the inventive concept.

The inventive concept is capable of a UFS (universal flash storage). FIG. 27 is a block diagram illustrating a UFS system in accordance with some embodiments of the inventive concept. Referring to FIG. 27, a UFS system 3000 may include a UFS host 3100, UFS devices 3200 and 3300, an embedded UFS device 3400, and a removable UFS card 3500. The UFS host 3100 may be an application processor of a mobile device. The UFS host 3100, the UFS devices 3200 and 3300, the embedded UFS device 3400, and the removable UFS card 3500 can communicate with external devices by UFS protocols. In at least one of the UFS devices 3200 and 3300, the embedded UFS device 3400, and the removable UFS card 3500, as described in FIGS. 1 through 24, string select lines or ground select lines may be connected to a pocket well through a one directional device. Thus, at least one of the UFS devices 3200 and 3300, the embedded UFS device 3400, and the removable UFS card 3500 can supply a constant voltage to the string select lines or the ground select lines, thereby preventing string select transistors or ground select transistors from being erased.

The embedded UFS device 3400 and the removable UFS card 3500 can communicate by protocols different from the UFS protocol. The UFS host 3100 and the removable UFS card 3500 can communicate by various protocols (for example, UFDs, MMC, SD (secure digital), mini SD, micro SD, etc.).

Figure 28:
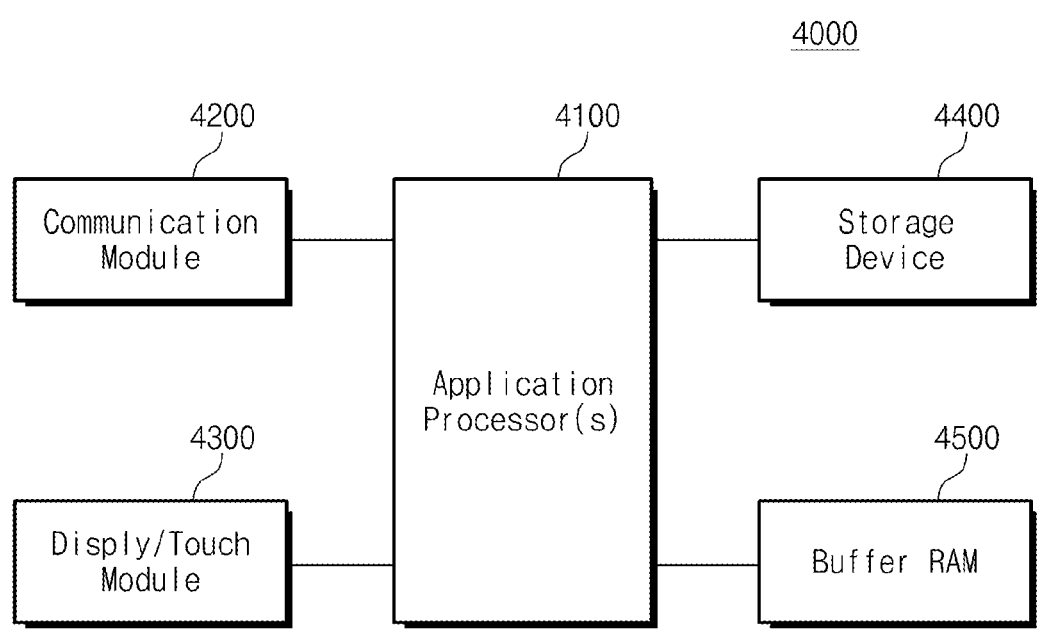
FIG. 28 is a block diagram illustrating a mobile device in accordance with some embodiments of the inventive concept.

The inventive concept is capable of a mobile device. FIG. 28 is a block diagram illustrating a mobile device in accordance with some embodiments of the inventive concept. Referring to FIG. 28, a mobile device 4000 may include an application processor 4100, a communication module 4200, a display/touch module 4300, a storage device 4400 and a mobile RAM 4500.

The application processor 4100 can control an overall operation of the mobile device 4000. The communication module 4200 may be embodied to control a wired/wireless communication with the outside. The display/touch module 4300 may be embodied to display data processed in the application processor 4100 or receive data from a touch panel. The storage device 4400 may be embodied to store data of a user. The storage device 4400 may be an eMMC, an SSD or a UFS device. the mobile RAM 4500 may be embodied to temporarily store data needed when processing the mobile device 4000.

In the storage device 4400, as described in FIGS. 1 through 24, string select lines or ground select lines may be connected to a pocket well through a one directional device. Thus, in an erase operation, the storage device 4400 can supply a constant voltage to the string select lines or the ground select lines, thereby preventing string select transistors or ground select transistors from being erased.

The memory system or the storage device according to some embodiments of the inventive concept can be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to some embodiments of the inventive concept, in an erase operation of a selected memory block, a nonvolatile memory device may be provided which supplies a voltage from a substrate to string select lines or ground select lines, thereby preventing string select transistors or ground select transistors from being erased.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device comprising:
    a substrate;
    a plurality of memory cells being stacked in a direction perpendicular to the substrate;
    a bit line;
    at least one string select transistor connected between the memory cells and the bit line;
    a string select line connected to the at least one string select transistor; and
    a one directional device connected between the substrate and the string select line and configured to transmit a bias voltage from the substrate toward the string select line in an erase operation.

2. The nonvolatile memory device of claim 1, wherein the one directional device comprises at least one diode.

3. The nonvolatile memory device of claim 2, wherein a cathode terminal of the at least one diode is connected to the string select line, and an anode terminal of the at least one diode is connected to the substrate.

4. The nonvolatile memory device of claim 3, further comprising a pass circuit for selecting the string select line; wherein the cathode terminal of the at least one diode is connected to the string select line between the pass circuit and the string select transistor.

5. The nonvolatile memory device of claim 2, wherein the at least one diode is defined by a doped active area on the substrate.

6. The nonvolatile memory device of claim 2, wherein the memory cells are stacked on a p-type pocket well formed on the substrate; and wherein the at least one diode is defined by a doped n-type active area on the p-type pocket well.

7. The nonvolatile memory device of claim 1, wherein the at least one string select transistor comprises at least two string select transistors each connected to a respective string select line; and wherein in an erase operation, the at least two string select lines receive the bias voltage through the one directional device.

8. A nonvolatile memory device comprising:
   a plurality of memory cells being stacked on a first pocket well in a direction perpendicular to the first pocket well;
   first and second string select transistors serially connected between the memory cells and a bit line;
   a first string select line being connected to the first string select transistor;
   a second string select line being connected to the second string select transistor;
   a first one directional device connected between the first pocket well and the first string select line and configured to transmit a first bias voltage from the first pocket well toward the first string select line in an erase operation; and
   a second one directional device connected between a second pocket well separated from the first pocket well and the second string select line and configured to transmit a second bias voltage from the second pocket well toward the second string select line in an erase operation.

9. The nonvolatile memory device of claim 8, wherein the first one directional device comprises at least one first diode, and the second directional device comprises at least one second diode.

10. The nonvolatile memory device of claim 9, wherein a cathode terminal of the first diode is connected to the first string select line, and an anode terminal of the first diode is connected to the first pocket well.

11. The nonvolatile memory device of claim 9, wherein a cathode terminal of the second diode is connected to the second string select line, and an anode terminal of the second diode is connected to the second pocket well.

12. The nonvolatile memory device of claim 9, wherein the first diode is defined by a doped first active area on the first pocket well, and the second diode is defined by a doped second active area on the second pocket well.

13. The nonvolatile memory device of claim 12, wherein the first and second pocket wells are defined by doped p-type semiconductor on an n-type substrate.

14. The nonvolatile memory device of claim 13, wherein the doped first active area is defined by doped n-type semiconductor on the first pocket well, and the second active area is defined by doped n-type semiconductor on the second pocket well.

15. The nonvolatile memory device of claim 8, wherein the plurality of memory cells define a three-dimensional memory array; wherein the three-dimensional memory array is monolithically formed in physical levels of memory cells having active areas disposed above a silicon substrate; wherein each of the plurality of memory cells includes a charge trap layer; and wherein at least one of word lines and bit lines in the three-dimensional memory array are shared between levels.

16. A method of making a nonvolatile memory device, the method comprising:
   stacking a plurality of memory cells in a direction perpendicular to a substrate;
   connecting at least one string select transistor between the memory cells and a bit line;
   connecting a string select line to the at least one string select transistor; and
   connecting a one directional device between the substrate and the string select line and configured to transmit a bias voltage from the substrate toward the string select line in an erase operation.

17. The method of claim 16, wherein the one directional device comprises at least one diode.

18. The method of claim 17, wherein a cathode terminal of the at least one diode is connected to the string select line, and an anode terminal of the at least one diode is connected to the substrate.

19. The method of claim 18, further comprising providing a pass circuit for selecting the string select line; wherein the cathode terminal of the at least one diode is connected to the string select line between the pass circuit and the string select transistor.

20. The method of claim 17, wherein the at least one diode is formed by doping an active area on the substrate.

* * * * *